(12) United States Patent
Ortner et al.

(10) Patent No.: US 11,534,754 B2
(45) Date of Patent: Dec. 27, 2022

(54) METHOD FOR PRODUCING FINE STRUCTURES IN THE VOLUME OF A SUBSTRATE COMPOSED OF HARD BRITTLE MATERIAL

(71) Applicant: Schott AG, Mainz (DE)

(72) Inventors: Andreas Ortner, Gau-Algesheim (DE); Andreas Roters, Mainz (DE); Hauke Esemann, Woerrstadt (DE); Markus Heiss-Chouquet, Bischofsheim (DE); Fabian Wagner, Mainz (DE); Laura Brueckbauer, Dorn-Duerkheim (DE); Stephanie Mangold, Klein-Winternheim (DE); Vanessa Hiller, Mainz (DE)

(73) Assignee: Schott AG, Mainz (DE)

( * ) Notice: Subject to any disclaimer, the term of this patent is extended or adjusted under 35 U.S.C. 154(b) by 558 days.

(21) Appl. No.: 16/395,569

(22) Filed: Apr. 26, 2019

(65) Prior Publication Data
US 2019/0329251 A1   Oct. 31, 2019

(30) Foreign Application Priority Data

Apr. 27, 2018   (DE) .................. 10 2018 110 211.9

(51) Int. Cl.
*B81B 1/00* (2006.01)
*B81C 1/00* (2006.01)
(Continued)

(52) U.S. Cl.
CPC .... *B01L 3/502707* (2013.01); *B23K 26/0006* (2013.01); *B23K 26/0624* (2015.10);
(Continued)

(58) Field of Classification Search
CPC ......................... B81B 1/006; B01L 3/502707
See application file for complete search history.

(56) References Cited

U.S. PATENT DOCUMENTS 6,857,449 B1 * 2/2005 Chow .................. B01J 19/0093
137/554
8,173,038 B2   5/2012 Wagner
(Continued)

FOREIGN PATENT DOCUMENTS

CN           103992948 B     11/2016
DE    10 2011 085 371 A1    5/2013
(Continued)

*Primary Examiner* — Moazzam Hossain
(74) *Attorney, Agent, or Firm* — Taylor IP, P.C.

(57) ABSTRACT

A method for producing a cavity in a substrate composed of hard brittle material is provided. A laser beam of an ultra-short pulse laser is directed a side surface of the substrate and is concentrated by a focusing optical unit to form an elongated focus in the substrate. Incident energy of the laser beam produces a filament-shaped flaw in a volume of the substrate. The filament-shaped flaw extends into the volume to a predetermined depth and does not pass through the substrate. To produce the filament-shaped flaw, the ultra-short pulse laser radiates in a pulse or a pulse packet having at least two successive laser pulses. After at least two filament-shaped flaws are introduced, the substrate is exposed to an etching medium which removes material of the substrate and widens the at least two filament-shaped flaws to form filaments. At least two filaments are connected to form a cavity.

7 Claims, 13 Drawing Sheets

(51) Int. Cl.
  *B01L 3/00* (2006.01)
  *B23K 26/00* (2014.01)
  *B23K 26/0622* (2014.01)
  *B23K 26/06* (2014.01)
  *B23K 26/364* (2014.01)
  *B23K 26/382* (2014.01)
  *C03C 15/00* (2006.01)

(52) U.S. Cl.
  CPC ...... *B23K 26/0648* (2013.01); *B23K 26/0665* (2013.01); *B23K 26/364* (2015.10); *B23K 26/382* (2015.10); *B81B 1/006* (2013.01); *B81C 1/00119* (2013.01); *C03C 15/00* (2013.01); *B01L 2200/12* (2013.01); *B81B 2201/051* (2013.01); *B81B 2203/0315* (2013.01); *B81B 2203/0353* (2013.01); *B81C 2201/0143* (2013.01); *B81C 2203/032* (2013.01)

(56) References Cited

U.S. PATENT DOCUMENTS

| | | |
|---|---|---|
| 2003/0235385 A1 | 12/2003 | Taylor et al. |
| 2009/0013724 A1 | 1/2009 | Koyo et al. |
| 2010/0025387 A1 | 2/2010 | Arai et al. |
| 2011/0207323 A1* | 8/2011 | Ditizio ............. H01L 21/02118 438/675 |
| 2015/0140735 A1 | 5/2015 | Hosseini |
| 2015/0165563 A1 | 6/2015 | Manley et al. |
| 2015/0166395 A1 | 6/2015 | Marjanovic et al. |
| 2016/0199944 A1 | 7/2016 | Hosseini |
| 2017/0256422 A1 | 9/2017 | Ambrosius et al. |
| 2018/0127701 A1* | 5/2018 | Zhang ................. B29C 37/0053 |
| 2020/0235020 A1* | 7/2020 | Boek ....................... H01L 23/15 |

FOREIGN PATENT DOCUMENTS

| | | |
|---|---|---|
| DE | 10 2013 103 370 A1 | 10/2014 |
| DE | 10 2014 113 339 A1 | 3/2016 |
| EP | 2 719 460 A1 | 4/2014 |
| EP | 3 037 826 A1 | 6/2016 |
| EP | 3 088 076 A1 | 11/2016 |
| EP | 2 547 618 B1 | 4/2017 |
| JP | 2013-188677 A | 9/2013 |

* cited by examiner

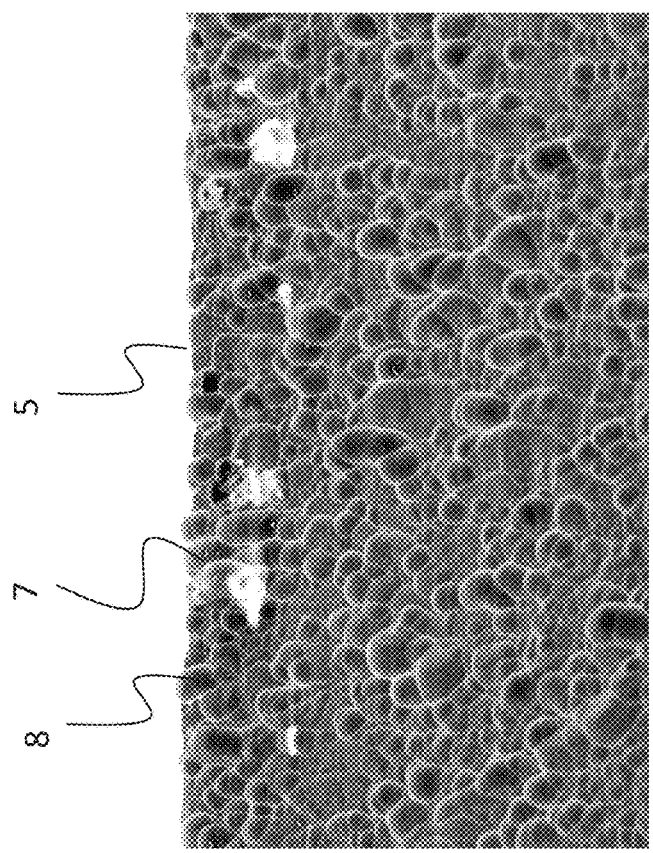
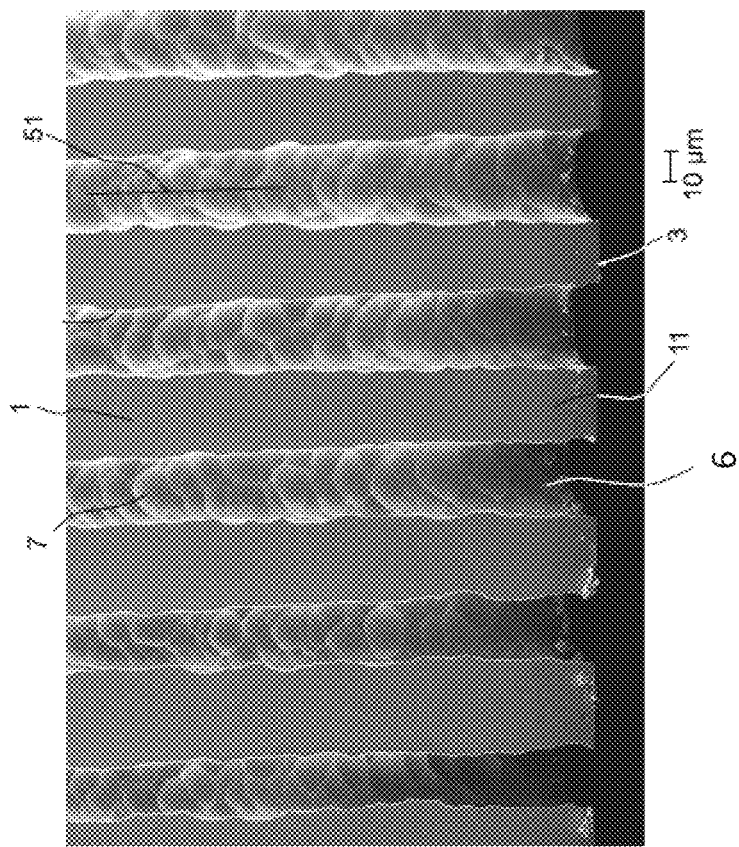
FIG. 3B
FIG. 3A

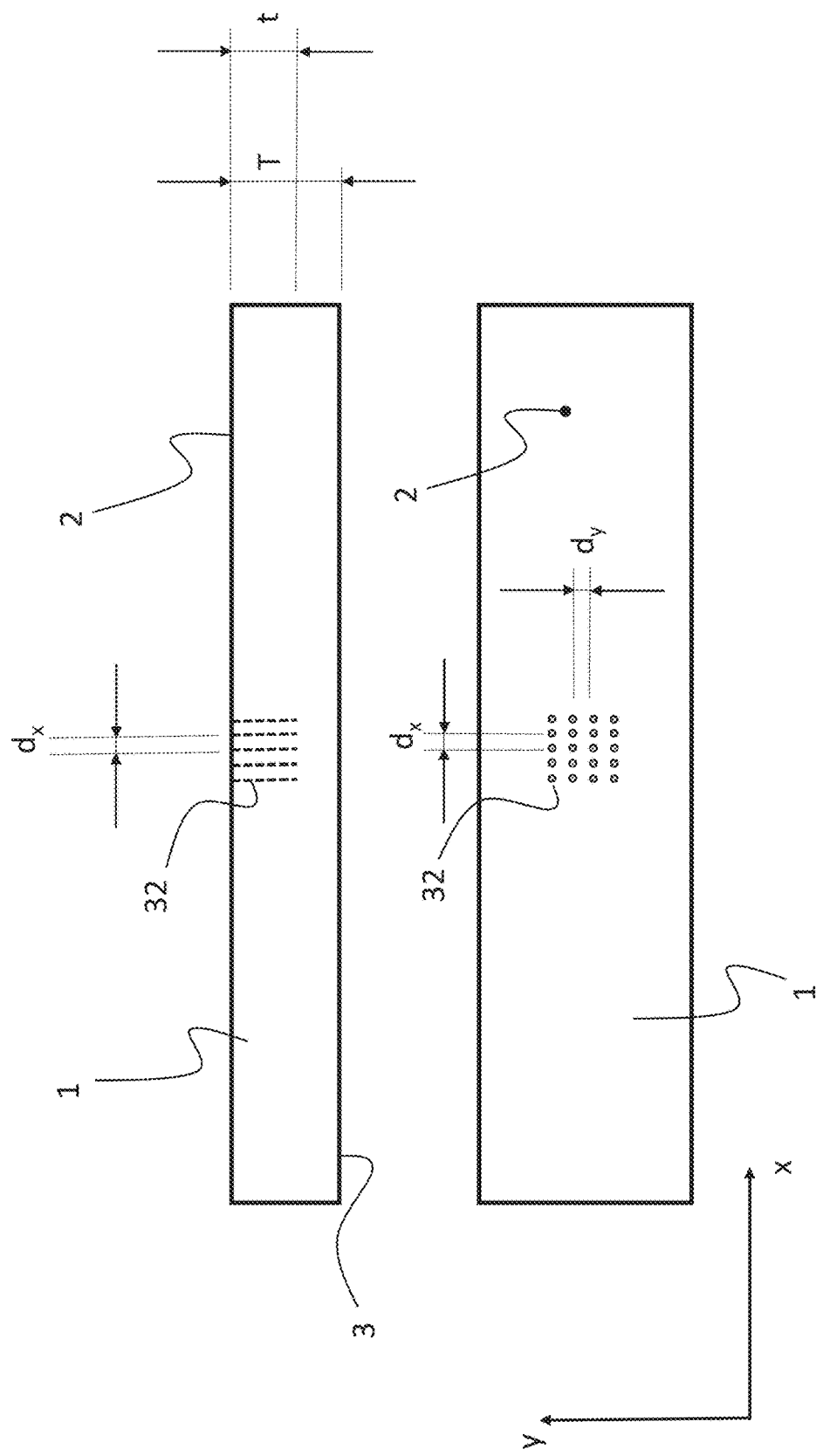

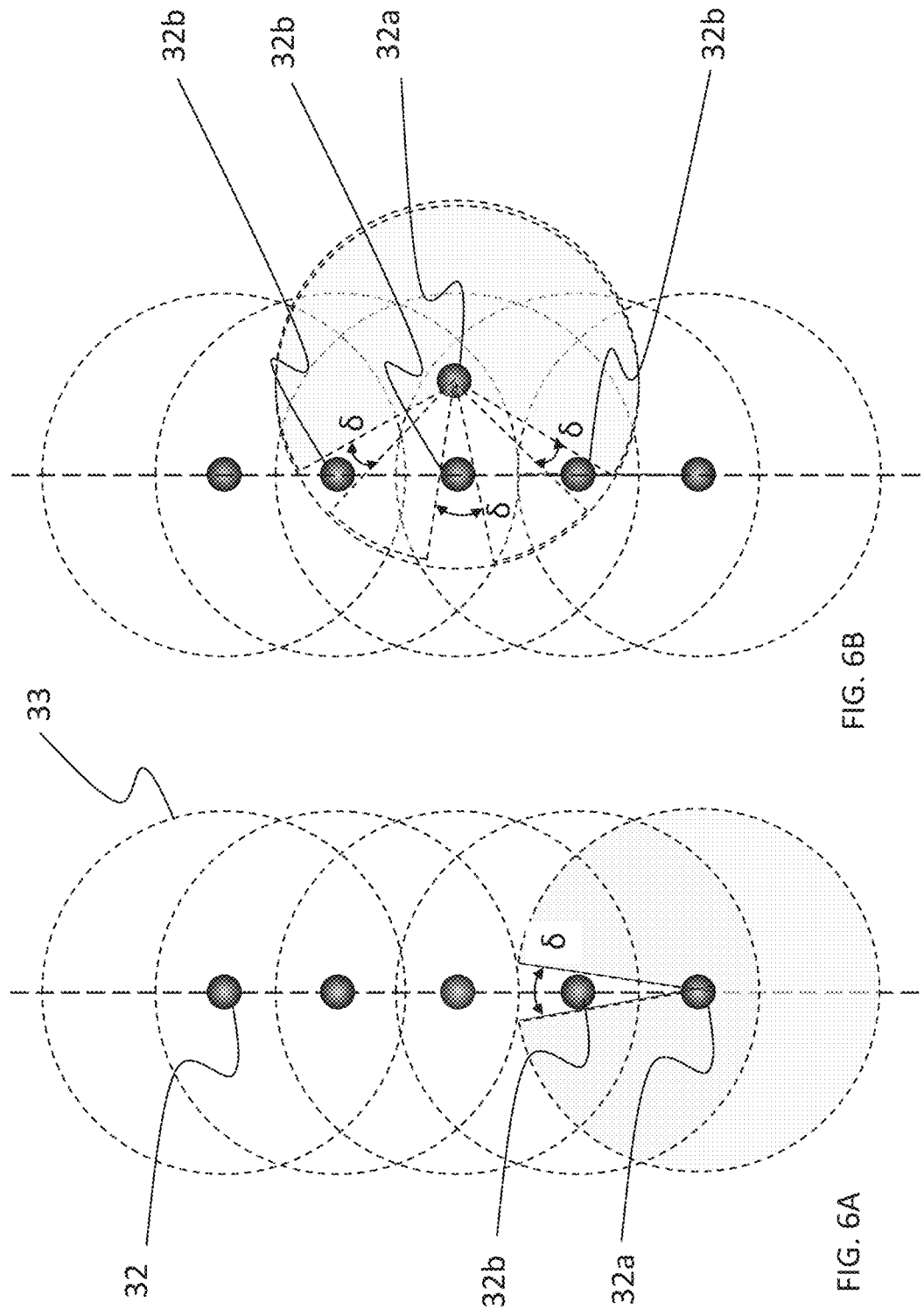

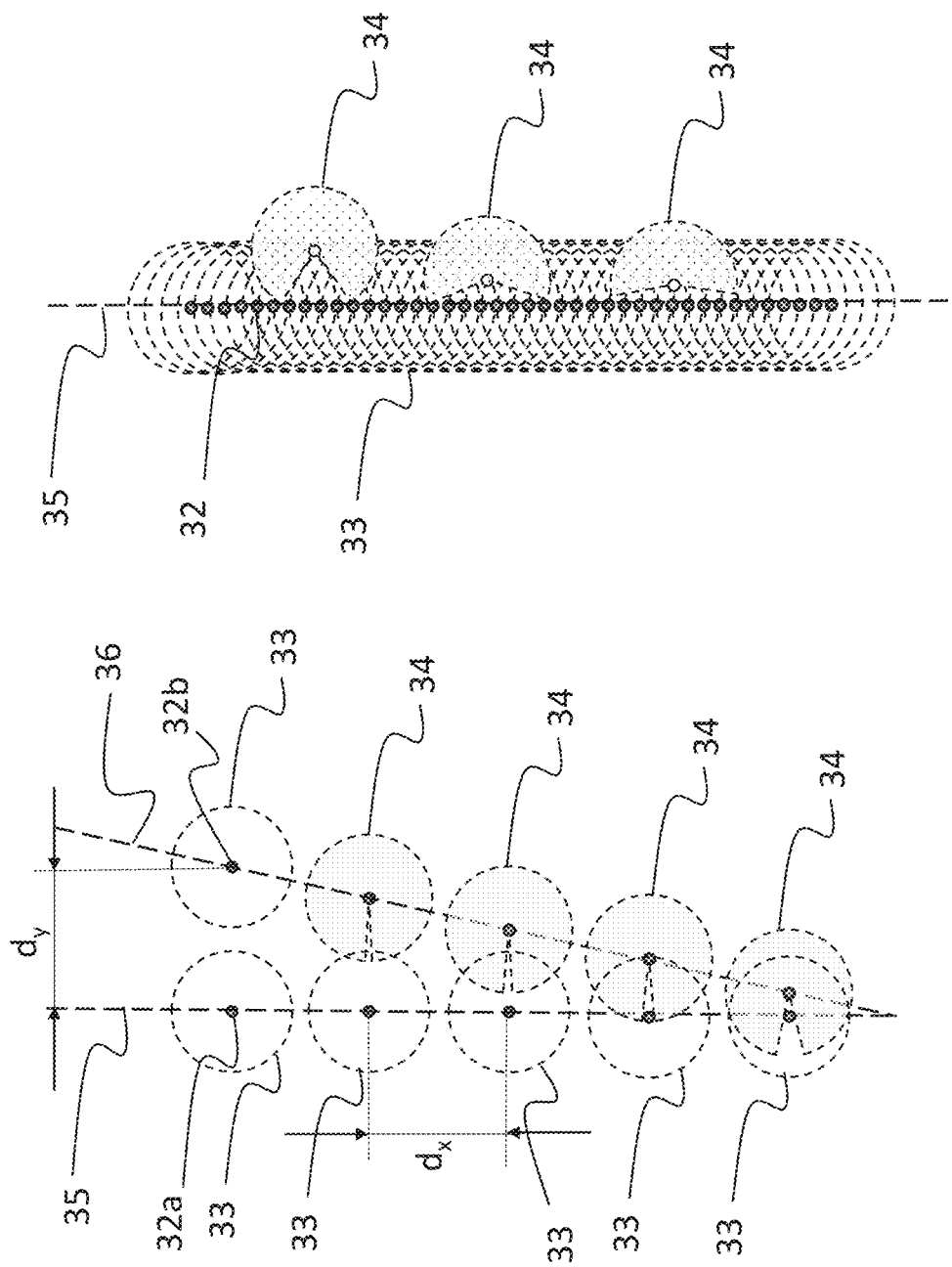

METHOD FOR PRODUCING FINE STRUCTURES IN THE VOLUME OF A SUBSTRATE COMPOSED OF HARD BRITTLE MATERIAL

BACKGROUND OF THE INVENTION

1. Field of the Invention

The present invention relates generally to a method for producing fine structures or cutouts in the volume of a substrate composed of hard brittle material, in particular in a glass or glass ceramic element. The invention furthermore relates to a glass or glass ceramic element produced by the method and having such structures or cutouts.

2. Description of the Related Art

The precise structuring of transparent, opaque or non-transparent glasses or glass ceramics is of great interest in many fields of application. Accuracies in the range of a few micrometers are required here. The structuring relates to holes (round and angular), cavities, channels or any freeform shapes. In order to be used in a wide field of application, the processing should leave behind no damage, residues or stresses in the marginal region or volume of the substrate.

Furthermore, such structuring is intended to allow as efficient a manufacturing process as possible. By way of example, various methods can be employed for producing holes. Besides sandblasting through appropriate masks, ultrasonic vibratory lapping is an established method. However, both methods are limited to small structures with regard to their scaling, said structures typically being approximately 400 µm in the case of ultrasonic vibratory lapping and a minimum of 100 µm in the case of sandblasting. On account of the mechanical removal of material, stresses in the glass, associated with flaking at the peripheral region of the hole, are additionally produced in the case of sandblasting. Neither method can be employed, in principle, for the structuring of thin glasses.

Recently, therefore, a large number of laser sources have been used for the structuring of various materials. Almost all known laser sources have been used here, such as $CO_2$ or CO lasers, diode-pumped ns, ps, and fs solid-state lasers having an infrared (e.g. 1064 nm), green (532 nm) and UV (365 nm) wavelength. Excimer lasers, which operate at extremely short wavelengths (e.g. 193 nm or 248 nm), are also used for processing.

U.S. Patent Application Publication Nos. 2015/0165563 A1 and 2015/0166395 A1 describe, for instance, laser methods for producing through-holes in thin glass, or else as preparation for later separation of pieces of glass.

The processing of glasses or glass ceramics is particularly demanding since they generally have a low thermal conductivity and a high susceptibility to fracture. All laser ablation methods therefore lead to more or less severe thermal loading or heat input, which does decrease at shorter wavelengths and shorter pulse lengths but sometimes still leads to critical stresses through to microcracks and deformations in the peripheral region of the holes. At the same time, distinctly measurable roughnesses are still produced on the hole walls with this method since all laser methods ablate in a cluster-like manner, i.e. the respective cluster size determines the residual roughness of the walls.

A disadvantage in the case of laser ablation methods is, furthermore, that deep structures can be achieved only with multiple passes over the workpiece to be processed. The processing speed is correspondingly slow. Therefore, the method is of only limited suitability for use in industrial manufacture. This applies particularly if through-openings or generally structures extending from one side surface to the opposite side surface are to be introduced in glasses. The walls of such structures, such as of trenches, for instance, also have an inclination, that is to say are not perpendicular.

A further problem, especially in the structuring of glasses or glass ceramics as hard brittle materials, is that the structures introduced can significantly reduce the strength under flexural loading since microcracks can arise during the structuring. A further disadvantage can be seen in that discharged material can accumulate.

German Patent Application DE 10 2013 103 370 A1 describes a method for introducing perforations into a glass substrate. In that case, firstly an opening is produced in a glass substrate by laser radiation, whereupon material is subsequently removed by an etching method.

A disadvantage of the known methods is that it is possible only with difficulty to produce filigree, complex structures in the volume of the glass or glass ceramic substrate with tenable outlay and high quality, i.e. with regard to the strength of the component.

SUMMARY OF THE INVENTION

Exemplary embodiments disclosed herein confront the need to produce a glass or glass ceramic element having at least one opening or cutout, but at the same time reducing the strength as little as possible. In this case, the intention is for microcracks to be introduced into the glass or glass ceramic element as little as possible by the method for producing the opening. At the same time, the process time of the method is also intended to be improved.

In particular, the intention is for it to be possible to be able to freely select geometric shapes for the cutout. In this case, the cutout produced in this way is intended, in particular, not to pass through the substrate, that is to say that the surface of the substrate situated opposite the cutout is intended to be maintained unchanged.

Exemplary embodiments disclosed herein address this need in a surprisingly simple manner by providing a method for producing a cavity in a substrate composed of hard brittle material and by a glass or glass ceramic substrate having such a cavity.

The invention accordingly relates to a method for producing at least one cavity in the volume of a substrate composed of hard brittle material, such as one comprising glass or glass ceramic.

Insofar as a substrate is mentioned below for simplification, this should be understood to mean a substrate comprising a hard brittle material. The substrate may be composed of glass or glass ceramic or comprises glass or glass ceramic.

A substrate provided according to the invention can be embodied, for example, in a plate-like fashion with two opposite side surfaces, although this does not constitute a prerequisite for carrying out the method. It is also not necessary for the substrate to be embodied as particularly thin, since through-openings that limit the thickness of the substrate are not intended to be produced. Substrates provided according to the invention can have a thickness of 500 µm or more.

The term "filament" is understood hereinafter to mean a very fine blind hole, that is to say an opening that does not pass through the substrate. According to the invention, a filament-shaped flaw is produced by a laser beam of an ultrashort pulse laser. Consequently, according to the invention, it is possible to obtain a substrate having at least one filament-shaped flaw that does not pass through the substrate as intermediate product. The diameter of said filament-shaped flaw is then increased by an etching process, as a result of which the filament can be formed. Consequently, according to the invention, it is furthermore possible to obtain a substrate having at least one filament that does not pass through the substrate as intermediate product.

The term "cavity" is understood hereinafter to mean an opening or else a cutout that can be produced by at least two filaments adjacent to one another by being connected on account of widening of the filaments involved in a subsequent etching process. Said opening is open towards a side of the substrate, that is to say to a side surface, and accordingly defines a cutout on the surface of the substrate. It can assume different geometric shapes or else more complex structures. Accordingly, a cavity is not a through-opening extending for instance from one side surface to the opposite side surface.

Exemplary embodiments of a method provided according to the invention includes the following steps:
- the laser beam of an ultrashort pulse laser is directed onto one of the side surfaces of the substrate and is concentrated by a focusing optical unit to form an elongated focus in the substrate,
- the incident energy of the laser beam producing a filament-shaped flaw in the volume of the substrate, which filament-shaped flaw extends into the volume to a predetermined depth and, in particular, does not pass through the substrate,
- wherein, in order to produce the filament-shaped flaw, the ultrashort pulse laser radiates in a pulse or a pulse packet having at least two successive laser pulses,
- wherein, after at least two filament-shaped flaws have been introduced,
- the substrate is exposed to an etching medium which removes material of the substrate at a removal rate of, for example, between 2 μm per hour and 20 μm per hour and
- the at least two filament-shaped flaws are widened to form filaments, and
- wherein at least 2 filaments, such as at least 20 filaments or at least 50 filaments, are connected to one another.

The invention furthermore encompasses a substrate composed of hard brittle material, such as comprising a glass or glass ceramic element, having at least one cavity. Said cavity in the volume of the substrate can be produced by a combined method, comprising a laser-based method for producing the filament-shaped flaw and a subsequent etching method for widening the flaw and forming the cavity.

In some embodiments, at least two or more filament-shaped flaws adjacent to one another are introduced into the substrate, wherein the material lying between the at least two filament-shaped flaws can then be concomitantly removed by the etching process and the cavity is thereby formed. The cavity, in terms of its dimensions, is thus larger than the filament-shaped flaw or a filament since material is removed by the etching process. A cavity may thus comprise at least two or more filament-shaped flaws and thus form a cutout.

This is surprising insofar as hitherto it has been assumed that the use of etching methods, that is to say widening a very small filament-shaped flaw in the material by an etching medium, requires a through-opening or else openings having a larger diameter. However, such a through-opening also requires a surface flaw on the opposite side surface of the substrate. Moreover, there are restrictions with regard to the thickness of the substrate which do not apply to the present invention.

The requirement of a through-opening was due to the assumption that the etching medium can penetrate into such a small filament-shaped flaw only because the etching medium can be drawn into the filament-shaped flaw from a first side with the aid of the capillary force, and wherein the gas present in the filament-shaped flaw can then escape on the other, opposite side.

Surprisingly, however, it has been established that the etching solution can also penetrate into filament-shaped flaws, that is to say blind holes or openings that do not pass through the substrate, and can expand them.

According to the invention, then, it is even possible to widen by an etching medium filament-shaped flaws that do not pass through the substrate and that have a diameter of at most 1 μm, such as at most 0.8 μm or at most 0.5 μm, measured in the substrate volume. Accordingly, the substrate or that region of the substrate which is provided for widening is exposed to the etching medium without the opening that is to be widened being continuous and extending from one side to the opposite side. The surface situated opposite the injection side of the laser radiation accordingly remains unchanged.

If the filament-shaped flaws produced by laser methods then lie sufficiently close together, it is possible, by the subsequent etching method, to strip away the remaining wall material between two adjacent filament-shaped flaws and to produce a complex cavity.

The pulse energy of the individual pulses is selected such that it is below the ablation threshold of the substrate material, such that the laser light can penetrate into the material and the laser energy is not already consumed at the surface by the ablation process.

By introducing the filament-shaped flaws, if the latter are produced alongside one another, and subsequent etching, it is accordingly possible to create a cavity in the volume of the substrate in a particularly expedient manner. The cavity can be formed with a varying taper angle. In this case, the taper angle indicates the angle of the wall of the cavity with respect to the adjoining side surface.

The taper angle is determined, in particular, by the removal rate in the etching process. At higher removal rates in a range of approximately 15 μm per hour to 20 μm per hour, a rather perpendicular formation of the cavity remains, thus resulting in a taper angle in a range of 90°+/−5°, such as 90°+/−3° or 90°+/−10. Greater deviations from a perpendicular formation of the cavity are established in the case of an etching process proceeding more slowly. This concerns for instance removal rates in a range of 2 μm per hour to 10 μm per hour.

The depth and the extent of the filament-shaped flaw in the volume of the substrate as a result of the incident energy of the laser beam are made possible by the targeted setting of the focal position relative to the substrate. For this purpose, it is possible to provide a corresponding optical unit that can be used to select the focal position and the depth.

The burst mode with a pulse packet being radiated in may be used here in order to obtain elongated, uniform flaws in the volume of the substrate down to the depth provided. This means, in particular, that the filament-shaped flaw does not pass through the substrate completely, but rather only through a partial section in relation to the thickness of the substrate at the stated location. Provision is made for the filament-shaped flaw to extend to not more than 80% in relation to the thickness of the substrate, such as not more than 70% or not more than 50%. In other words, the length of the filament-shaped flaw is not more than 80% of the thickness of the substrate at the location of the flaw, such as not more than 70% or not more than 50%.

In this context, it should furthermore be taken into consideration that the subsequent etching process also results in further material removal in the bottom region of the filament-shaped flaw. In order reliably to exclude the occurrence of preliminary damage of the opposite side in this case, it is regarded as expedient if the filament-shaped flaws extend into the substrate to a depth of not more than 80%, such as not more than 70%, in relation to the thickness.

As etching medium, an etching solution may be used rather than plasma etching. In accordance with this embodiment, the etching is thus carried out wet-chemically. This is advantageous in order to remove substrate constituents from the surface during etching. Both acidic and alkaline solutions can be used as etching solutions. Suitable acidic etching media are, in particular, HF, HCl, $H_2SO4$, ammonium bifluoride, $HNO_3$ solutions or mixtures of these acids. For basic etching media, consideration may be given to KOH or NaOH solutions. Greater removal rates can typically be achieved using acidic etching solutions. Basic solutions may be used, however, especially since only a slow removal of material is sought anyway. Furthermore, the etching may be carried out in a temperature range of 40° C. to 150° C., such as 50° C. to 120° C. or up to 100° C.

In general, siliceous glasses having a low alkali metal content are particularly suitable for the structuring according to the invention. Excessively high alkaline metal contents make etching more difficult. It has proved to be expedient to use glasses having basicities in the range of 0.45 to 0.55, such as in the range of 0.48 to 0.54. This makes the glasses particularly suitable for controlled etching using basic etching mediums, although etching using acidic etching mediums also remains possible. In accordance with some embodiments of the invention, provision is therefore made for the glass of the glass element to be a silicate glass having a content of alkaline metal oxides of less than 17 percent by weight.

However, it is also possible to produce a cavity in glass ceramics, in particular according to the LAS system, by the method.

In the burst operating mode provided for the invention, the laser energy is not emitted as a single pulse, but rather as a sequence of pulses which are emitted in quick succession and together form a pulse packet, a so-called burst. Such a pulse packet typically has a somewhat greater energy than a single pulse in the conventional single-shot mode of operation. However, in return, the pulses of a burst themselves contain significantly less energy than a single pulse. With regard to the pulses within a burst, provision can be made for the pulse energies to be flexibly adjustable, in particular for the pulse energies to either remain substantially constant or for the pulse energies to increase or for the pulse energies to decrease.

A suitable laser source according to the present invention is a neodymium-doped yttrium aluminium garnet laser having a wavelength of 1064 nanometers. Operation with frequency doubling (SHG, "second harmonic generation") or frequency tripling (THG, "third harmonic generation") is also possible. When selecting the laser source, care should be taken to ensure that the substrate material is at least partly transparent to the corresponding wavelength of the laser radiation.

The laser source generates, for example, an initial beam having a $(1/e^2)$ diameter of 12 mm; a biconvex lens having a focal length of 16 mm can be used as an optical unit. If appropriate, a suitable beam-shaping optical unit, such as a Galilean telescope, for example, can be used for generating the initial beam. The laser source operates, in particular, with a repetition rate that lies between 1 kHz and 1000 kHz, such as between 2 kHz and 200 kHz or between 3 kHz and 100 kHz.

The repetition rate and/or the movement speed, that is to say the speed at which the laser radiation is guided relative to the substrate, can be selected here such that the desired distance between adjacent filament-shaped flaws is achieved.

The suitable pulse duration of a laser pulse lies in a range of less than 100 picoseconds, such as less than 20 picoseconds. The typical power of the laser source here may be in a range of 20 to 300 watts. In order to obtain the filament-shaped flaws, in accordance with some embodiments, use is made of a pulse energy in the burst of more than 400 microjoules, such as a total burst energy of more than 500 microjoules.

When the ultrashort pulse laser is operated in the burst mode, the repetition rate is the rate of repetition of the emission of bursts. The pulse duration is substantially independent of whether a laser is operated in single-pulse operation or in the burst mode. The pulses within a burst typically have a pulse length similar to that of a pulse in single-pulse operation. The burst frequency can lie in the range of 15 MHz to 90 MHz, such as in the range of 20 MHz to 85 MHz, and is 50 MHz, for example, and the number of pulses in the burst can be between 2 and 20 pulses, such as between 3 and 8 pulses, e.g. 6 pulses.

The filament-shaped flaw can, for instance, also constitute a sequence of local defects arranged in succession, for instance in the form of a series of filament-shaped flaws extending into the depth of the substrate, which extend into the volume to the depth provided. Accordingly, it is also not necessary to use particularly thin substrates.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 3A illustrates an electron microscope micrograph of an edge of a glass element in an enlarged view;

FIG. 3B illustrates by way of example an electron microscope micrograph of a wall of a cavity;

FIG. 4 illustrates an arrangement of filament-shaped flaws in a series in the volume of a substrate in a side view;

FIG. 5 illustrates a plan view of a side surface of a substrate with a matrix-shaped arrangement of filament-shaped flaws;

FIG. 6A illustrates the mutual influencing, during the production of a new filament-shaped flaw, by adjacent filament-shaped flaws that have already been produced;

FIG. 6B illustrates the mutual influencing, during the production of a new filament-shaped flaw, by a plurality of adjacent filament-shaped flaws that have already been produced;

FIG. 7A illustrates a determination of the material-dependent relationship on the basis of two chains of filament-shaped flaws which run towards one another along two straight lines;

FIG. 7B illustrates an arrangement for measuring the shielding effect of a chain of a multiplicity of filament-shaped flaws along a straight line;

Corresponding reference characters indicate corresponding parts throughout the several views. The exemplifications set out herein illustrate embodiments of the invention and such exemplifications are not to be construed as limiting the scope of the invention in any manner.

DETAILED DESCRIPTION OF THE INVENTION

In the following detailed description, identical reference signs designate substantially identical parts in or on these embodiments, for the sake of clarity. For better elucidation of the invention, however, the exemplary embodiments illustrated in the figures are not always depicted in a manner true to scale.

Figure 1:
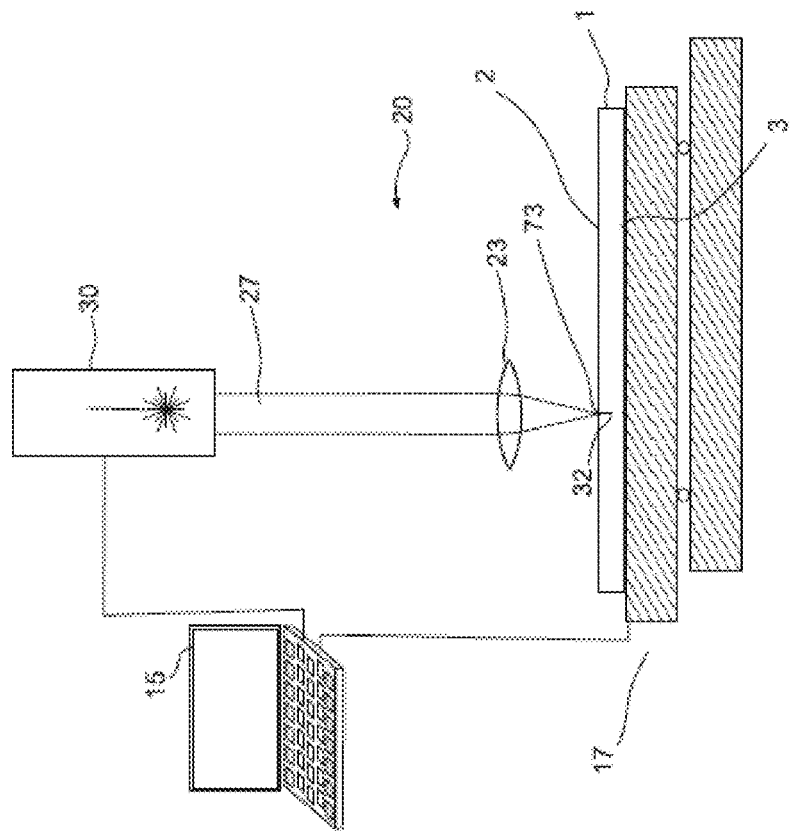
FIG. 1 illustrates an apparatus for the laser processing of the glass elements as preparation for subsequent etching.

FIG. 1 shows one exemplary embodiment of a laser processing apparatus 20, which can introduce filament-shaped flaws 32 into a substrate, a glass element 1 in the example, in order subsequently to produce the cavity therefrom in an etching process. The apparatus 20 comprises an ultrashort pulse laser 30 with upstream focusing optical unit 23 and a positioning device 17. The positioning device 17 enables the lateral positioning of the point of impingement 73 of the laser beam 27 of the ultrashort pulse laser 30 on the side surface 2 of the, in the example plate-like, glass element 1 to be processed. In the example illustrated, the positioning device 17 comprises an x-y table, on which the glass element 1 bears on a side surface 3. However, it is also possible, alternatively or additionally, to embody the optical system in mobile fashion in order to move the laser beam 27, such that the point of impingement 73 of the laser beam 27 is movable with the glass element 1 being kept fixed.

The focusing optical unit 23 then focuses the laser beam 27 to form a focus that is elongated in the beam direction, in particular perpendicularly to the irradiated side surface 2. Such a focus can be produced for example by a conical lens (a so-called axicon) or a lens having high spherical aberration. The control of the positioning device 17 and of the ultrashort pulse laser 30 may be carried out by a programmed computing device 15. In this way, the envisaged positions for introducing the filament-shaped flaws 32 can be calculated, in particular by position data being read in, such as from a file or via a network.

In the example illustrated, the filament-shaped flaw 32 shown passes into the volume of the glass element 1 to a depth corresponding approximately to half the thickness of the, in the example plate-like, glass element 1.

The invention provides for the length of the filament-shaped flaw 32 to be not more than 80% of the thickness of the substrate at the location of the introduced filament-shaped flaw 32, such as not more than 70% or not more than 50%.

In accordance with one exemplary embodiment, the following parameters can be used for the laser beam:

The wavelength of the laser beam is 1064 nm, typical of an Nd:YAG laser. A laser beam having an initial beam diameter of 12 mm is generated, and this is then focused by an optical unit in the form of a biconvex lens having a focal length of 16 mm. The pulse duration of the ultrashort pulse laser is less than 20 ps, such as approximately 10 ps. The pulses are emitted in bursts having 2 or more, such as 4 or more, pulses. The burst frequency is 12 to 48 ns, such as approximately 20 ns, the pulse energy at least 200 microjoules, and the burst energy is correspondingly at least 400 microjoules.

Subsequently, after the introduction of one or, in particular, a multiplicity of filament-shaped flaws 32, the glass element 1 is removed and placed in an etching bath, where substrate material, that is to say glass in the exemplary embodiment, is removed along the filament-shaped flaws 32 in a slow etching process, such that a filament is produced in the volume of the glass element 1 at the location of such a flaw 32.

A basic etching bath having a pH of >12 may be used, for example a KOH solution having a concentration of >4 mol/l, such as >5 mol/l or >6 mol/l, but <30 mol/l. In accordance with one embodiment of the invention, the etching is carried out at a temperature of the etching bath of >70° C., such as >80° C. or >90° C., irrespective of the etching medium used.

Figure 2:
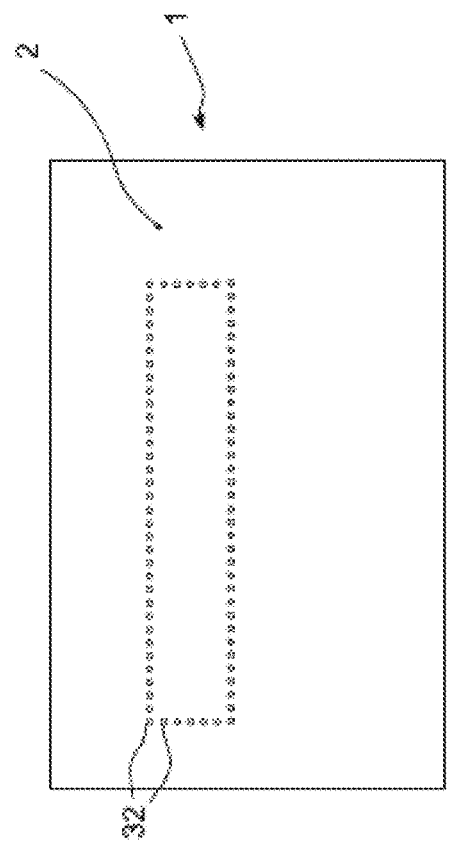
FIG. 2 illustrates a glass element with introduced filament-shaped flaws in a plan view.

FIG. 2 shows, in a plan view of a side surface 2, a glass element 1 having a multiplicity of filament-shaped flaws 32 arranged in a specific pattern such as can be written into the glass element 1 by the above-described computer-controlled driving of the positioning device 17 and of the ultrashort pulse laser 30. Specifically, the filament-shaped flaws 32 have been introduced into the glass element 1 here, by way of example, along a predefined path in the form of a closed rectangular contour or shape. The corners of the line can also be slightly rounded. It is evident to the person skilled in the art that not just rectangular paths but paths of any desired shape can be traversed by the method.

The method according to the invention is based on an embodiment wherein the point of impingement 73 of the laser beam 27 on the substrate is guided along a predefined path or to predetermined positions and at the positions provided, filament-shaped flaws 32 are produced by the targeted setting of the focal position relative to the substrate to an envisaged depth in the volume of the substrate, and the etching subsequently produces a widening of the filament-shaped flaw 32 to form a filament in the volume of the substrate.

In some embodiments, the optical unit 23 is likewise embodied as controllable, such that the exact focal position and depth in the substrate can be selected in a particularly simple manner. In this way, it is possible to produce filament-shaped flaws 32 at different levels in the substrate.

The diameter of the filament-shaped flaw 32 is increased by the subsequent, isotropic etching. In this case, it is possible to produce a cavity by connecting at least two mutually adjacent filaments in the subsequent etching process. The steep angle of the filament-like flaw 32, that is to say the taper angle, is maintained in the case of a slow isotropic etching, that is to say a low rate of removal of material.

According to the invention, this widening for combining filaments lying alongside one another is desired in order to produce a cavity 5 having a complex geometry and/or to form a cavity 5 comprising a plurality of filaments.

FIG. 3A shows an electron microscope micrograph of a longitudinal section through a plurality of filament-shaped flaws 32 arranged in a series in a glass element 1 processed according to the invention. An edge having a multiplicity of laterally open filaments 6 extending parallel alongside one another is evident. Said filaments are of elongate shape in the example. In the example depicted, the filaments 6 have arisen at the locations of the former filament-shaped flaws as a result of the etching process; a combination of adjacent filament-shaped flaws has not yet taken place in this example. In the illustration in FIG. 3A in a plan view of the sectional edge, it is evident that the longitudinal direction 51 of the filaments 6, in particular proceeding perpendicularly from a side surface 3, extends into the volume of the glass element 1.

FIG. 3A furthermore clearly reveals the fine structure of the filament 6, that is to say the shape of the sidewall of the filament 6, in the form of subsequently hemispherical, or rounded, cap-shaped depressions 7. As a result of the slow etching process that is preferred, these substantially hemispherical depressions 7 adjoin one another, wherein the mutually abutting concave rounded portions of the depressions 7 form burrs.

The distance between the filaments 6 is relatively large in this example, with a value of approximately 50 µm. The distance can also be chosen to be smaller, particularly in the case where the filaments 6 merge directly into one another without planar edge sections 11. Generally, the distance between the filaments 6 (also referred to as "pitch") may be in the range of 3 to 70 µm, such as at least 10 µm or at least 20 µm. In this case, said distance is measured from center to center of the filaments 6.

FIG. 3B shows by way of example an electron microscope micrograph of a wall 8 of a cavity 5. The hemispherical surface on the wall 8 is clearly discernible. The example depicted involves the wall 8 of a cavity 5 which has been introduced according to the invention into a transparent, colorless borosilicate glass such as can be procured for example under the designation D263T from Schott AG, Mainz. The filament-shaped flaws 32 introduced previously were widened at a temperature of the etching medium of 80° C. over a period of 19 hours.

It is readily evident from FIG. 4, which schematically shows a longitudinal section through a glass element 1 having, in the example, a total of five filament-shaped flaws 32 already introduced, that the filament-shaped flaws 32 do not completely penetrate through the glass element 1, but rather only constitute blind holes.

According to the invention, the filament-shaped flaws 32 are subjected to the etching medium, which is unusual insofar as, despite the embodiment as blind hole, the etching solution can penetrate into the filament-shaped flaws 32 and bring about the homogeneous, i.e. isotropic, widening. The filament-shaped flaws 32 have very small dimensions in this case. The filament-shaped flaws 32 taken as a basis for the wall 8 of the cavity 5 as shown in FIG. 3B have a diameter of only at most 1 µm. Even smaller diameters still, such as of at most 0.8 µm or of at most 0.5 µm, do not form an obstacle to the etching process according to the invention.

In some embodiments, a plurality of filament-shaped flaws 32 are introduced into the glass element 1 in a manner lying alongside one another. Depending on the length t of a filament-shaped flaw 32 in the glass element 1, the size of the filament-shaped flaw 32 in cross section and the distance dx between two adjacent filament-shaped flaws 32, it is possible in this way to produce cavities 5 having a complex geometry, that is to say cutouts of different basic shapes or cross sections, in the volume of the substrate.

FIG. 4 illustrates some essential geometric relationships which concern the embodiment of filament-shaped flaws 32 in the glass element 1. The example shows five filament-shaped flaws 32 arranged alongside one another in a series and having the length t in the volume of a substrate, in the example a glass element 1, having the thickness T.

As explained above, the filament-shaped flaws 32 do not completely penetrate through the substrate, such that it holds true that: t<T. In order to accelerate the introduction of the filament-shaped flaws into the substrate, the length thereof is expediently selected to be as small as possible since the introduction of longer filament-shaped flaws, precisely for producing complex structures requiring a multiplicity of such filament-shaped flaws, is very time-consuming. In some embodiments, it holds true that t<0.8*T, such as t<0.7*T or t<0.5*T.

Besides the depth in the substrate, the distance between two adjacent filament-shaped flaws is accorded a central importance. In this case, said distance is measured from center to center of the filament-shaped flaws 32 and is designated by $d_x$ in FIG. 4. This "pitch" accordingly represents a predefined variable for the method control.

In order to produce three-dimensional internal structures in the volume of the substrate, wherein said internal structures are then characterized in that they have only opening to one of the side surfaces of the substrate and the opposite side surface of the substrate is unchanged in terms of its surface, the filament-shaped flaws 32 are impressed into the volume of the substrate in a two-dimensional structure or a pattern, proceeding from one side surface.

FIG. 5 schematically shows a plan view of a side surface of a substrate having a matrix-shaped arrangement of filament-shaped flaws 32, in a 4×5 arrangement in the example. The internal contour that can be produced with this geometric arrangement of the filament-shaped flaws 32 after the etching process is of rectangular shape provided that distance and depth of the filament-shaped flaws 32 satisfy the requirements mentioned. It is evident to the person skilled in the art that just on account of the arrangement of the filament-shaped flaws 32 on the side surface of the substrate, different geometric figures can be produced, for example also internal contours in a glass element 1 having a triangular or circular basic shape, or else freeform surfaces.

In FIG. 5, the distance between two adjacent filament-shaped flaws 32 in the two dimensions is indicated by $d_x$ and, perpendicular thereto, by $d_y$. In the case of a matrix-shaped arrangement of the filament-shaped flaws 32, the distances in these two directions can be equal, but need not be, such that the condition $d_x \neq d_y$ is also possible. In the course of the etching process, these distances between adjacent filament-shaped flaws 32 lead to a specific formation of the bottom and the wall 8 of the cavity 5, which will be discussed further below to give a deeper understanding. $d_x = d_y$ has been chosen in the example depicted.

For widening the filament-shaped flaws 32 to form the cavities having the desired structure by the etching process, it is of great importance that the filament-shaped flaws 32 be fully developed during introduction into the substrate material.

The development of the filament-shaped flaws 32 can be disadvantageously influenced by contaminants on the surface of the substrate. Shading of the laser beam can occur here, such that the beam shaping or the beam intensity can be disadvantageously influenced. This can result in undesired deviations in the production of the filament-shaped flaws 32 in the substrate, i.e. the envisaged depth and/or the envisaged orientation are/is not achieved.

In this respect, although a small distance between two adjacent filament-shaped flaws 32 is regarded as expedient for creating larger structures and minimizing the removal of material between two adjacent filament-shaped flaws 32 or the time required for this, nevertheless care should be taken, on the other hand, to ensure that a specific minimum distance is complied with and an excessively great spatial proximity of the filament-shaped flaws 32 to one another is avoided.

This is due to the circumstance that the spatial proximity of the adjacent filament-shaped flaws 32 at the current operating point, that is to say the position at which precisely a new filament-shaped flaw 32 is produced, has a great influence on the development of the filament-shaped flaw just produced, on account of the shielding effect of the neighbouring filaments. In the case of optical set-ups that operate by spherical aberration or a Bessel beam, the production of the filament-shaped flaw 32 is dependent on the supply of laser energy, which is carried out as rotationally symmetrically as possible with respect to the focal line.

If a first chain is formed along a path by juxtaposition of filaments, for example, then the energy supply for producing a new filament-shaped flaw 32a is disturbed only by the adjacent filament-shaped flaw 32b already produced. This is shown purely by way of example in FIG. 6A, which is intended to elucidate the mutual influencing, during the production of a new filament-shaped flaw, by an adjacent filament-shaped flaw already produced.

The influence of an adjacent filament-shaped flaw 32b on the production of a new filament-shaped flaw 32a is dependent on the mutual distance between the filament-shaped flaws 32, 32a, 32b, on the diameter of the filament-shaped flaws 32 produced, and thus overall on the solid angle portion in which the existing filament-shaped flaw 32b represents a shading for the energy supply for the new filament-shaped flaws 32a. In the example, this region is represented by the angle δ. The respective zone of influence 33 of the laser radiation is identified in the example by a circle indicating the outer boundary, proceeding from a center point corresponding to the point of impingement 73 of the laser beam 27. The reference sign 34 denotes a zone of influence which is subject to shading since it at least partly overlaps a zone of influence 33 of a filament-shaped flaw introduced earlier.

A further crucial variable is the diameter of the filament-producing laser beam on the side surface 2,3 of the substrate. During the production of a new filament-shaped flaw 32a in the vicinity of a plurality of filament-shaped flaws 32b already produced, for example alongside an already existing series of filament-shaped flaws 32b, in the event of excessively great proximity half of the energy theoretically available is already shielded in a plurality of solid angle portions.

This is shown purely by way of example in FIG. 6B, which illustrates the mutual influencing, during the production of a new filament-shaped flaw 32a, by a plurality of adjacent filament-shaped flaws 32b already produced. In this case, the shielding of the individual solid angle portions δ adds up to a total shielding. Overall, therefore, the achievable maximum length of a filament-shaped flaw 32a in proximity to an adjacent filament-shaped flaw 32b is a function of their mutual distance. Knowledge of this functional relationship is utilized according to the invention for the optimization of the process strategy and thus for the method control for the production of a cavity according to the invention.

This relationship is material-dependent and will be briefly outlined with reference to FIGS. 7A and 7B. In order to ascertain the material-dependent relationship, a first step involves determining the shielding effect of an individual filament-shaped flaw 32a (FIG. 7A). This is done by firstly introducing into the substrate, along a first straight line 35, a chain of filament-shaped flaws 32a having a radius R, which are spaced apart from one another at the constant distance $d_x$, wherein it holds true that: $d_x \gg R$. The distance between them may be chosen with a magnitude such that no influencing by a filament-shaped flaw 32a already present occurs. This prerequisite is generally given if it holds true that: $d_x > 50*R$, such as $d_x > 100*R$.

Along a second straight line 36, a second chain of filament-shaped flaws 32b is produced at x-positions identical to those in the case of the first chain, but with constantly reduced distance $d_y$. $d_y = d_x$ can be chosen as a starting value. A second chain of filament-shaped flaws arises, wherein the associated second straight line 36 runs continuously towards the first straight line 35. By measuring the produced length of the filament-shaped flaw depending on the mutual distance between the filament-shaped flaws, it is then possible for the optimum distance to be determined and utilized for the further method. The length can be determined for example using a light microscope, for instance after opening the filament line, or else by photographs taken in conjunction with image processing methods, e.g. edge extraction algorithms for the edge.

The optimum distance between two adjacent filament-shaped flaws 32a, 32b is then that minimum distance $d_y$ for which there is just about no reduction of the length of the filament-shaped flaw by mutual influencing or for which differences in the etching behaviour cannot yet be established.

The shielding effect by a chain consisting of a multiplicity of filament-shaped flaws 32 along the straight line 35 (FIG. 7B) can be measured in an analogous manner. As in the example previously, this involves firstly introducing into the substrate, along a straight line 35, a chain of filament-shaped flaws 32 having a radius R, which are spaced apart from one another at the constant distance $d_x$. Afterwards, individual filament-shaped flaws 32 are produced at different distances $d_y$ and the length of the filament-shaped flaws 32 is once again determined depending on their distance from the straight line 35.

In certain cases it may be necessary to produce filament-shaped flaws 32 at a distance from one another which is smaller than that distance which has been found to be expedient on the basis of the measurement of the shielding as explained above. This means that a distance is chosen for which a shortening of the length of the filament-shaped flaw can occur.

Figure 8B:
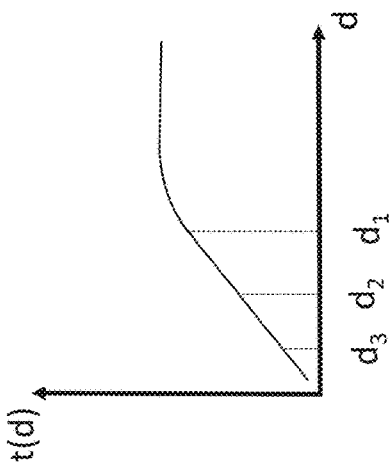
FIG. 8B illustrates the relationship between the distance between two filament-shaped flaws and the expected filament depth.
Figure 8A:
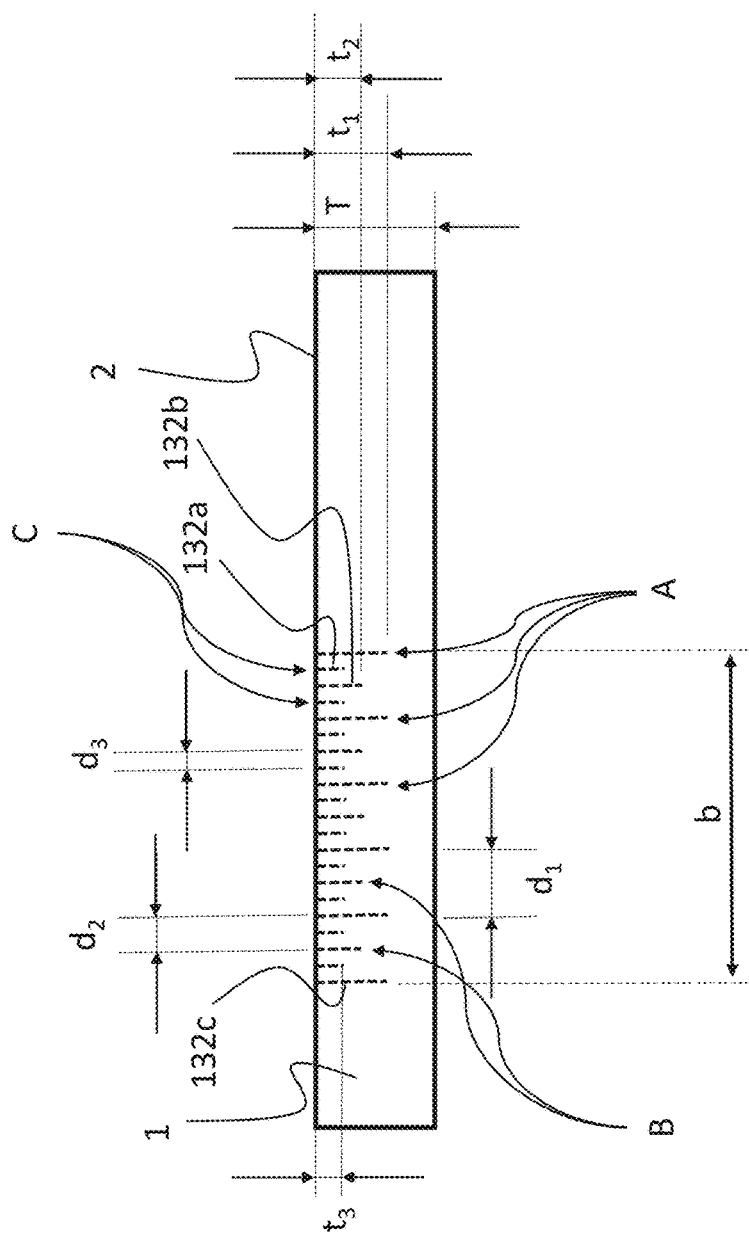
FIG. 8A illustrates a method with a three-stage refinement for producing filament-shaped flaws at a very small distance from one another.

The method illustrated in FIGS. 8A and 8B can be utilized for this purpose. In order to produce e.g. a chain of filament-shaped flaws 132 along a path at a closer distance from one another in this sense, a method comprising a plurality of steps is selected.

A first step involves producing a chain of filament-shaped flaws 132c along the envisaged path with maximum possible length at a minimum distance from one another, wherein the minimum distance means that distance between two adjacent filament-shaped flaws 132 for which there is just about no mutual influencing during exposure to laser radiation.

A second step involves producing centrally between two adjacent filament-shaped flaws 132c in each case a further new filament-shaped flaw 132b having a smaller length, which cannot be implemented with the original length on account of the shielding by the adjacent filament-shaped flaws 132c. A recursive refinement of this procedure is carried out as necessary.

FIG. 8A illustrates this method with a three-stage refinement. Along a path, in the example of a straight line having a length b, in the example firstly the filament-shaped flaws 132c having the maximum depth $t_1$ are produced, said depth being established on account of the minimum distance $d_1$ complied with. This step A thus comprises producing the longest filament-shaped flaws 132c.

Exactly centrally between two adjacent filament-shaped flaws 132c in each case, a further new filament-shaped flaw 132b having the depth $t_2$ is produced, which on both sides is at a distance $d_1/2=d_2$ from the adjacent filament-shaped flaws 132c.

This second step B thus comprises producing the shorter filament-shaped flaws 132b.

Finally, a third step C involves producing between two adjacent filament-shaped flaws 132b in each case a further new filament-shaped flaw 132a having the depth $t_3$, which on both sides is at a distance $d_2/2=d_3$ from the adjacent filament-shaped flaws 132b. A particularly close juxtaposition of filament-shaped flaws 132 can be achieved in this way, said filament-shaped flaws then each having a depth which depends on the respective step of their production. FIG. 8B shows the relationship between the distance d between two filament-shaped flaws 132 and the expected filament depth $t=t(d)$. In this case, two adjacent filament-shaped flaws 132 have a different depth.

By the three-stage method shown in FIG. 8A, after carrying out the etching process, it is possible to create a cavity 5 having the width b with the maximum depth $t_1$ plus a magnitude owing to the widening as a result of the etching process.

Of course, it is also possible to carry out the method with more than the three iterations presented above, in order to achieve even closer distances between the filament-shaped flaws 132. In this case, therefore, a multiplicity of filament-shaped flaws 32, 132 are introduced into the substrate at a minimum distance for which no shielding takes place yet and afterwards, in one or more iterations, a further filament-shaped flaw is introduced in each case into the center between two adjacent filament-shaped flaws 32, 132. In this case, the depth of filament-shaped flaws arranged alongside one another is generally then not identical, but rather dependent on the respective iteration in the method sequence during which the filament-shaped flaw was produced.

In principle, it is possible that the focal line length produced by the beam-shaping optical unit may exceed the thickness of the substrate. In this case, however, consideration should be given to ensuring that the side of the substrate situated opposite the injection opening is not modified since undesired damage to the rear surface of the substrate as well can otherwise occur during the subsequent etching process. This can be remedied for example by altering the distance between the focusing optical unit 23 and the substrate, that is to say for instance an increase in the distance between the optical unit 23 and the surface of the substrate or of the glass element 1 mentioned in the example, and/or by a suitable refocusing by the optical system.

This is furthermore influenced by the distance between the filament-shaped flaws. Said distance is in turn dependent on the envisaged depth of the cavity and the optical system used. With the use of an optical system having spherical aberration, for example with the use of an optical unit in the form of a biconvex lens having a focal length of 16 mm, a free aperture of 18 mm and a tubular beam of 12 mm (at $1/e^2$) at 1064 nm, and a desired depth of the cavity to be produced of up to 0.5 mm, distances between the filament-shaped flaws 32 of at least 10 µm, such as at least 20 µm, have proved to be advantageous.

It is also possible to produce cavities 5 having a larger depth down to approximately 5 mm. The depth of the cavities 5 can also be chosen to be smaller. In this case, a minimum depth of at least 50 µm, such as at least 100 µm or at least 200 µm, is expedient in order to be able to fully benefit from the advantages of the method according to the invention, including vis à vis ablation.

The distance between the filament-shaped flaws in turn also influences the development of the bottom surface of the cavity. Two fundamental variants can be differentiated here:

1) The filament-shaped flaws are introduced in a matrix-shaped manner in a grid at the same distance from one another. In this case, it holds true that: $d_x=d_y$. As a result of the etching process, the bottom of the cavity develops with a homogeneous wave structure that is substantially dependent on the chosen distances $d_x$ and/or $d_y$.

2) The filament-shaped flaws are introduced in line progressions: in this case, the filament-shaped flaws can be introduced in each case along adjacent paths in the first direction at a first distance from one another of approximately 4-6 µm. At a second distance, further paths of filament-shaped flaws are added to the first, wherein the distance between the paths is chosen to be greater than the first distance. By way of example, this second distance can be 10 µm or more. A cavity produced in this way has a bottom having a furrow structure after the etching process.

In the exemplary embodiment mentioned above, the arrangement of the paths is selected depending on the desired shape of the cavity, i.e. the arrangement can be effected in an arbitrary pattern, for example in the form of a matrix. In this case, the chains or paths used for producing the cavities need not be manifested as straight, but rather can be chosen in any freeform shape.

For the two variants 1) and 2) mentioned above it holds true, in principle that the structures that arise in the bottom of the cavity are brought about by the interplay between material modification by the ultrashort pulse laser and the etching process. This bottom structure is characteristic of the filamentation strategy.

What both variants 1) and 2) furthermore have in common is that, after the etching process, the walls 8 of the cavity 5 having a structure having a multiplicity of hemispherical depressions 7, as is shown for example in FIG. 3B.

In some embodiments, the cavity 5 produced according to the invention in the volume of the substrate comprises at least two regions having different depths. In such embodiments, the filament-shaped flaws 32, 132 are introduced into the substrate with different lengths and/or different focal positions.

It has been found to be advantageous, in the case of so-called surface cavities, wherein the cavity 5 is produced on the incidence side of the laser in the substrate, to introduce firstly the deeper and thus longer filament-shaped flaws 32, 132 and afterwards the shorter filament-shaped flaws. The opposite order has proved to be advantageous when producing so-called rear side cavities, which are accordingly produced on the side surface of the substrate that is situated opposite the incidence side of the laser.

Figure 9A:
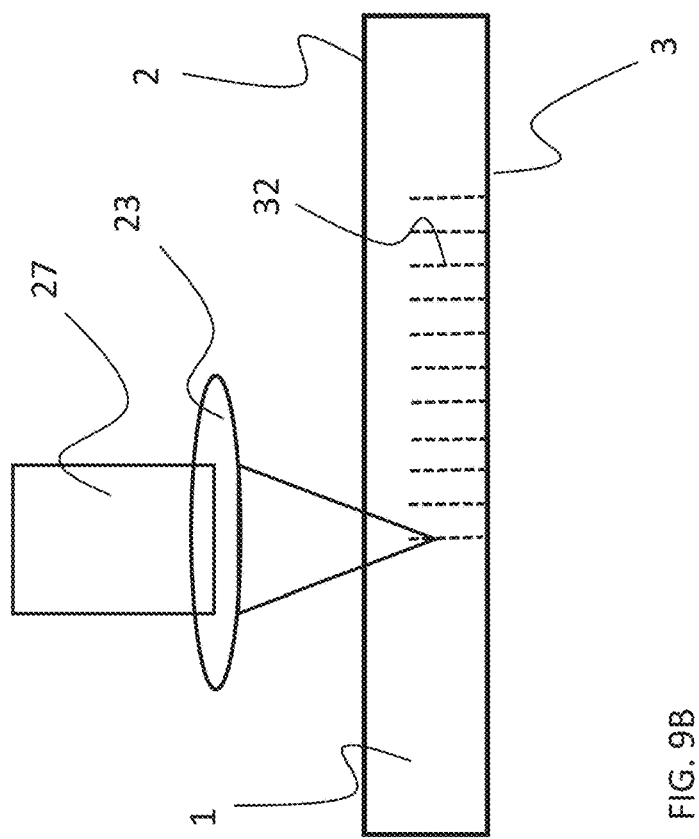
FIG. 9A illustrates the introduction of rear-side filament-shaped flaws for producing rear-side cavities.
Figure 9B:
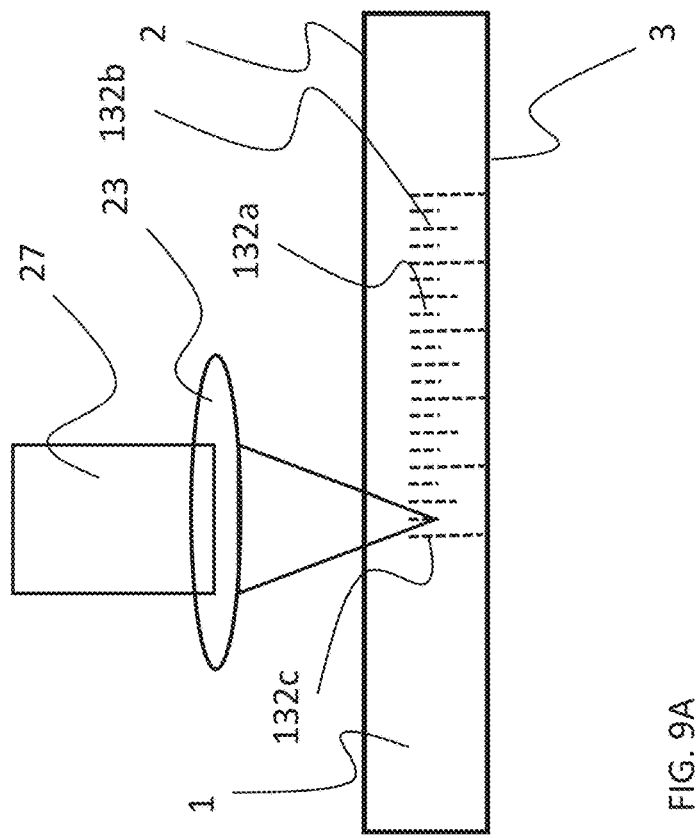
FIG. 9B illustrates the introduction of rear-side filament-shaped flaws for producing rear-side cavities.

Generally the production of rear side cavities has been found to be advantageous since the distances between filaments can be chosen to be smaller. On the incidence side, fewer contaminants occur as a result of the laser process, such that the filaments can be introduced better with the envisaged depth and direction. FIGS. 9A and 9B show the introduction of rear-side filament-shaped flaws 32 for the production of the rear side cavities. In this case, a cavity 5 forms with a bottom having a furrow-like shape in the case of the embodiment shown in FIG. 9A and a homogenous, wavy shape in the case of the embodiment shown in FIG. 9B.

Figure 10B:
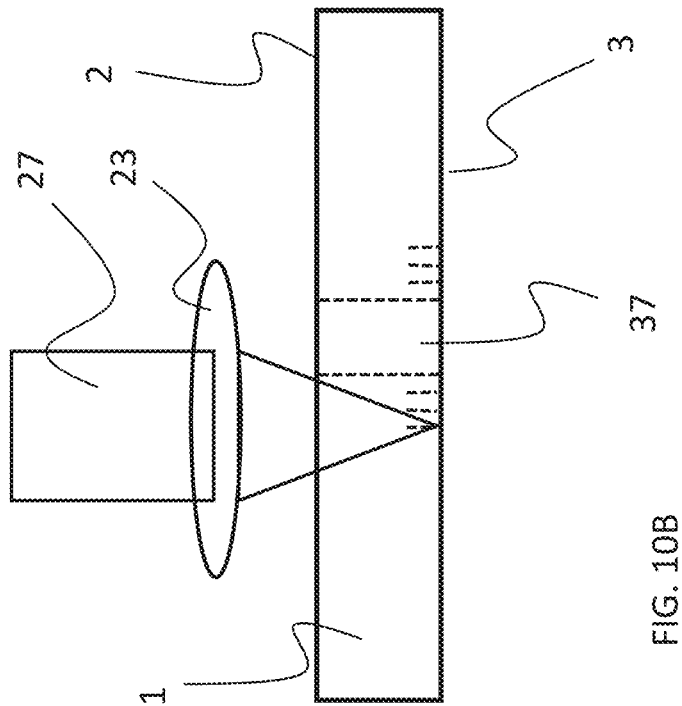
FIG. 10B illustrates an exemplary embodiment for producing cavities at different depths in the substrate.
Figure 10A:
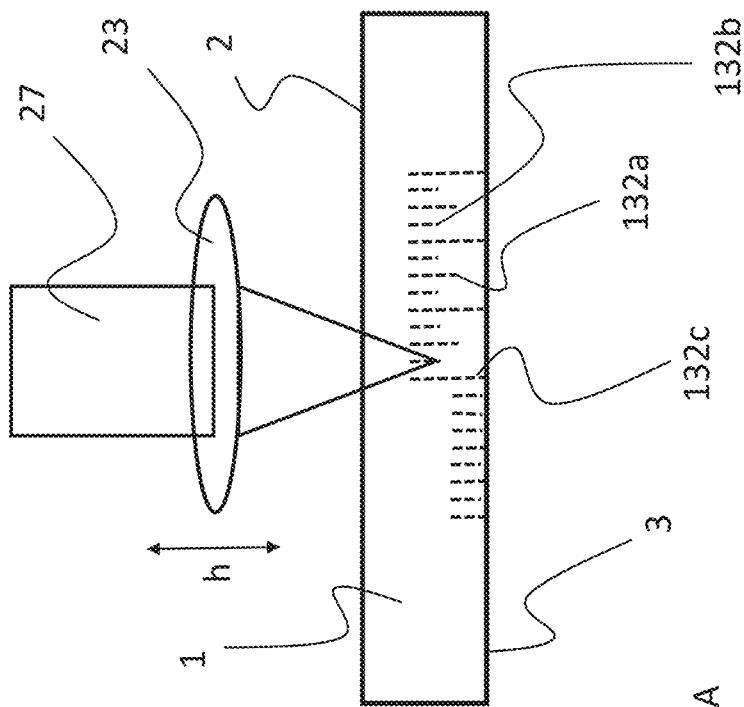
FIG. 10A illustrates an exemplary embodiment for producing cavities at different depths in the substrate.

It is possible, in principle, as shown in FIG. 10A, also to produce cavities having different depths in the substrate and thus even to produce steps, which can also be used in combination with through-holes 37, as indicated in FIG. 10B, for producing blind holes, that is to say have the cross-sectional shape of a step having a concentric cross section.

In contrast to the illustration in FIGS. 10A and 10B, the distances between the filament-shaped flaws may be set in such a way that the filaments form with full length. In other words, the minimum distance between two adjacent filament-shaped flaws without influencing of the respective production is complied with.

In some embodiments, at least one interface of the substrate is wetted with a liquid if the filament-shaped flaws are introduced. In this case, there is an opportunity to employ various variants:

1) Wetting the rear-side surface of the substrate, that is to say the side surface situated opposite the incidence side of the laser, in order to reduce the difference in refractive index at the rear side. Avoiding or reducing the difference in refractive index results in avoiding or minimizing the surface damage.
2) Wetting the front-side surface of the substrate, that is to say the side surface facing the incidence side of the laser, in order to reduce contaminants at the top side. This may result in undesired damage and/or influencing of the development of the filaments, i.e. they may have a distinctly smaller depth.
3) Wetting both sides in order to reduce the difference in refractive index at the rear side and in order to reduce contaminants at the top side of the substrate.

In this case, producing the filament-shaped flaws 32, 132 under liquid additionally has the further advantage that the hollow spaces opened are not filled with air, but rather with liquid. This accelerates the later etching process. Some exemplary embodiments here include producing the filament-shaped flaws under an etching solution as described above.

Figure 11A:
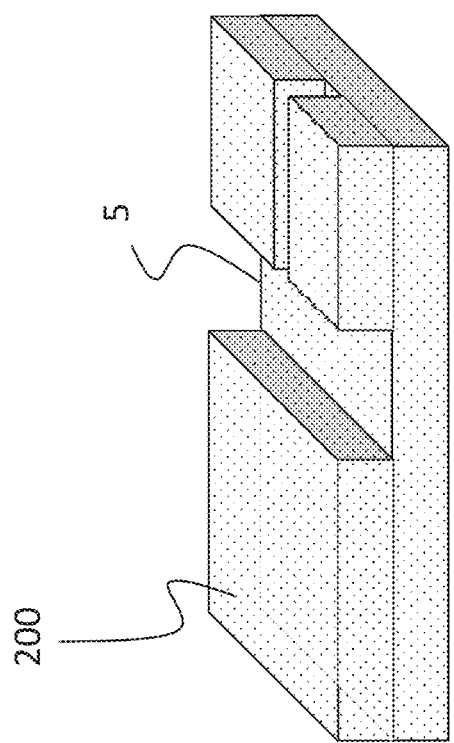
FIG. 11A illustrates, in a respective oblique view, a substrate having a surface structure produced according to the invention.
Figure 11C:
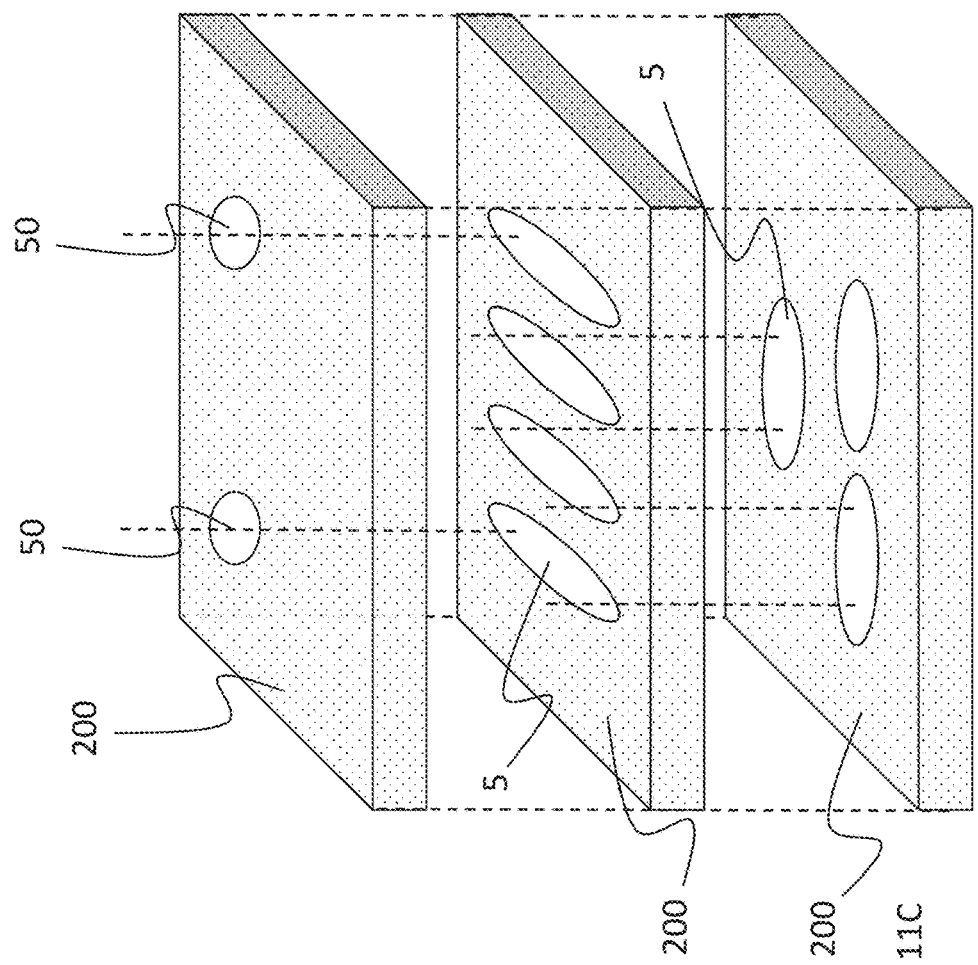
FIG. 11C illustrates, in a respective oblique view, a substrate having a surface structure produced according to the invention.
Figure 11B:
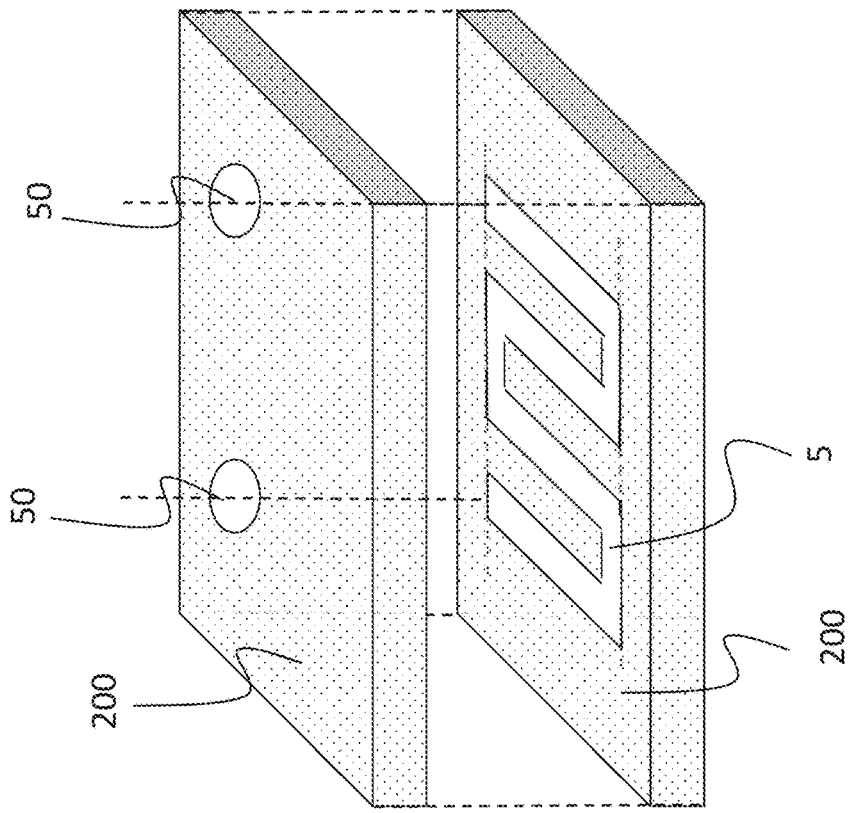
FIG. 11B illustrates, in a respective oblique view, a substrate having a surface structure produced according to the invention.

FIGS. 11A, 11B, and 11C schematically show, in a respective oblique view, substrates, in the example glass elements 200, having a surface structure into which a cavity 5 was produced by the above-described method according to the invention. In this case, FIGS. 11B and 11C show a layer construction, comprising two and three glass elements 200, respectively. Glass elements 200 structured in this way, also referred to hereinafter as wafers, and the layer constructions produced therefrom comprising two or more wafers typically find application in the field of microfluidics as so-called microfluidic chips, or microfluidic cells, which make it possible to examine the properties and reactions of chemical and biological materials in a systematic, automated form. The reactants involved are typically introduced into the flow channels (introduced trenches) and reaction chambers through the through-holes 50 situated in the cover glasses and the reaction products are subsequently analysed. The method according to the invention for producing the cavities 5 can be utilized for the production of these very fine reaction chambers. Thus, in accordance with a further aspect, the invention relates to a microfluidic cell 12 having a substrate 1 in the form of a glass element having at least one cavity 5.

Figure 12:
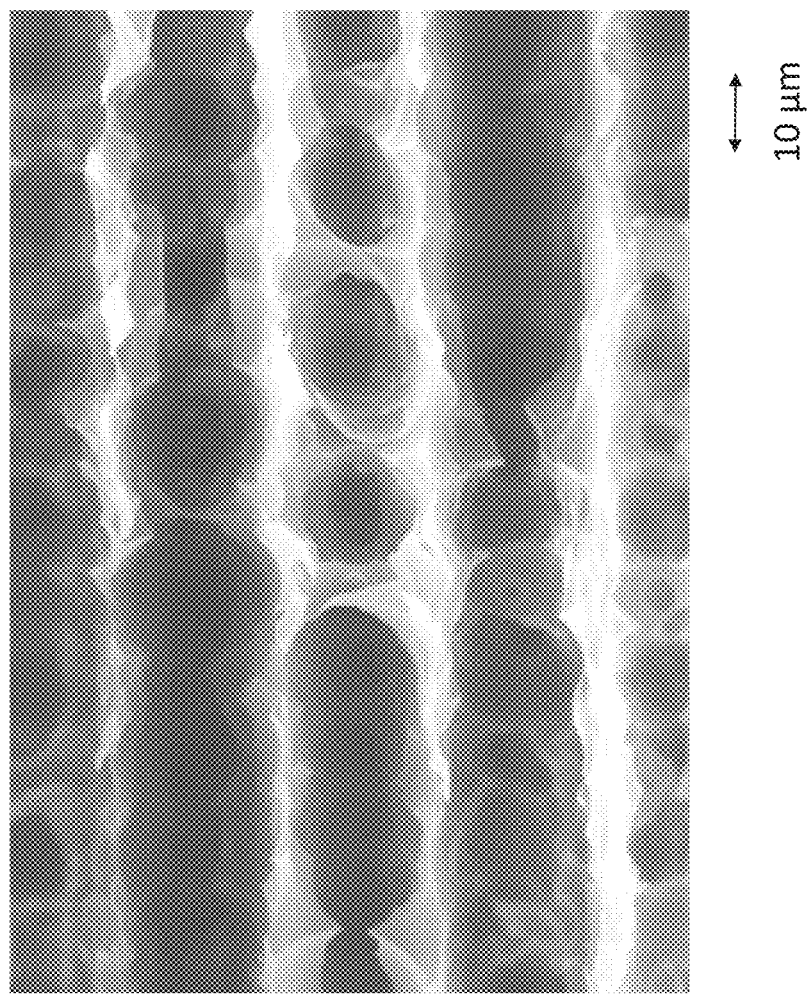
FIG. 12 illustrates a plan view of an excerpt from a glass element having cavities.

FIG. 12 shows a plan view of an excerpt from a glass element in which a cavity 5 was produced according to the invention by filamentation and etching.

In this case, the desired region of the cavity 5 was rastered with filament-shaped flaws 32 at a pitch distance of >20 $\mu m=d_x$ and 5 $\mu m=d_y$. In this case, the filament-shaped flaws 32 were not developed completely through the glass volume, but rather only from one side surface to the desired depth. During the later etching process, these individual filament-shaped flaws 32 were then connected to form a continuous area, as a result of which a cavity 5 according to the invention was formed. In the example depicted, the bottom surface of the cavity 5 and also the side walls have a structure having substantially hemispherical depressions.

Figure 13B:
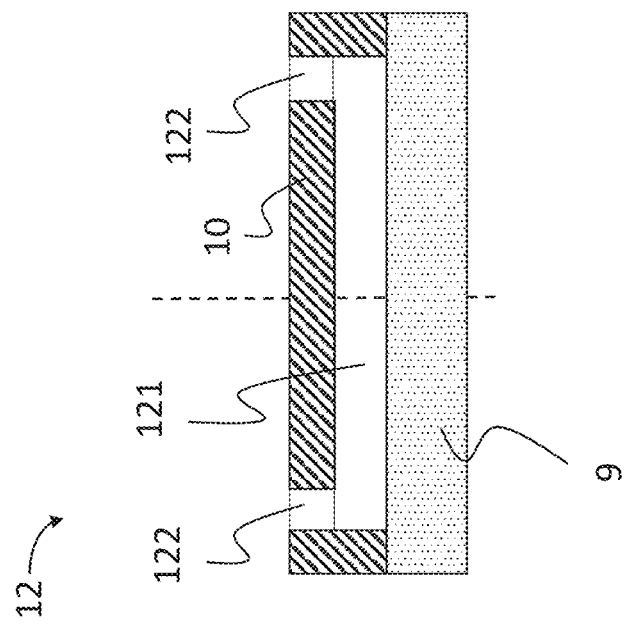
FIG. 13B schematically illustrates a further arrangement of two wafers composed of glass for use as a microfluidic chip.
Figure 13A:
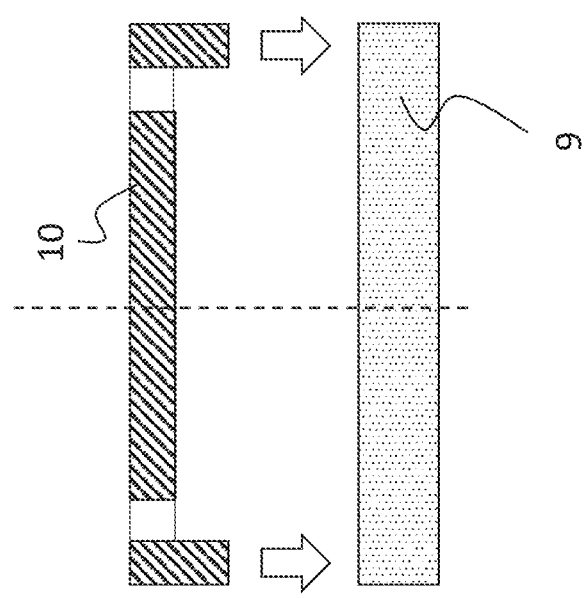
FIG. 13A schematically illustrates a further arrangement of two wafers composed of glass for use as a microfluidic chip.

FIGS. 13A and 13B show schematically, in an example kept simple for the sake of clarity, a further arrangement of two substrates, in the example two wafers 9, 10 composed of glass, for use as a microfluidic cell 12.

In this case, the wafer 9 is of flat, planar shape, whereas the wafer 10, likewise of flat, planar shape, comprises two through-holes 122 and also a cavity 121. The layer construction of the microfluidic cell 12 is shown in FIG. 13B. In this case, the cavity 121 produced according to the invention constitutes the reaction chamber. The two through-holes 122 serve for filling and emptying.

The method provided according to the invention for producing a filament in a substrate composed of hard brittle material, such as in glass or glass ceramic, can accordingly be used in an excellent manner to create particularly fine and filigree surface structures.

It is thus particularly well suited to supporting the production of microfluidic chips, or microfluidic cells.

The production of microfluidic cells in accordance with a further aspect of the invention will be described in greater detail below. The simplest way to produce a microfluidic cell is by combining a lower part structured with channels with a cover having accesses to the channels. In the current prior art, these are produced from polymers, e.g. by the injection molding method. Corresponding arrangements are known for example from European Patent Application EP 2 719 460 B1 and German Patent Application DE 10 2011 085 371 A1. However, producing a microfluidic cell from two polymeric components results in the following disadvantages:

Polymers are often not resistant to solvents used or lead to non-specific reactions with biological molecules introduced (lack of biocompatibility).

The intrinsic fluorescence and also the limited transparency of the polymers influence or disturb the read-out quality during the detection of the fluorescence-labelled substances.

The polymer surface is moreover accessible to functionalization with biomarkers only to a limited extent.

As a solution approach in this regard, it has already been proposed to produce a microfluidic cell from three components, in which the lower and upper components consist of glass and thus allow a high scope of functionalization. Moreover, the channel structure is produced by an organic polymer or silicone component, which is connected to upper and lower parts for example by an adhesive already applied before the structuring. In this case, a polymer component is described in European Patent Application EP 2 547 618 B1, and elements composed of silicone are described in Japanese Patent Application JP2013188677 A2 and Chinese Patent Application CN103992948 B. European Patent Application EP 3037826 A1 furthermore discloses a microfluidic cell comprising a sandwich of an elastomer layer between two glass substrates. The connection is effected for example by direct bonding of the surfaces activated by corona discharge. European Patent Application EP 3088076 A1 also describes multilayered cells in which the channel structures are introduced in silicone layers.

However, the combination of the glass material and the polymer material has the disadvantage that the different coefficients of expansion of the components during analysis, which passes through various temperature cycles, can result in a deformation and, in the extreme case, a leakage of the cell. Moreover, the problem of biocompatibility and intrinsic fluorescence is not solved by this approach.

Furthermore, in the case of the plastic interlayer, the problem exists that, as a result of the lack of stiffness of the plastic, the channel structures, which are often very thin and long, can be aligned with the structures of the lower and upper parts only to a deficient extent during the joining-together process. Since cost-effective production can only be made possible by the fabrication of large substrates having a plurality of cells simultaneously, the alignment problem is additionally intensified.

According to one aspect of the invention, the solution to the challenges mentioned above is realized by producing a microfluidic cell from three glass components, in which the central component (also referred to here as interposer) consists of a structured thin glass and is bonded to a cover and a base by an adhesive applied on both sides after the structuring. As a result, all three components are composed of an inert, non-fluorescent and readily functionalizable material. Stresses resulting from thermal expansions of different magnitudes do not occur. The tightness of cells can easily be ensured by the use of adhesive-bonding technology. As a result of applying the adhesive to the structured component, both the base and the cover with their surface facing the cell can be provided with biomarkers cost-effectively, individually and over the whole area before the components are joined together. Moreover, what is allowed by adhesive-bonding technology is that small particles can be enclosed by the adhesive and thus do not disturb the bonding process any further and the tightness of the cell remains ensured. The requirements made of the cleanness of the process environment are thus correspondingly less stringent. In this case, at least one of the glass components also has a cavity 5 such as can be produced by the laser-assisted etching method described here.

Specifically, it is provided that in order to produce a microfluidic cell, a cavity is introduced into a sheet-like glass element 200 by a procedure in which the laser beam 27 of an ultrashort pulse laser 30 is directed onto one of the side surfaces 2, 3 of the glass element 200 and is concentrated by a focusing optical unit 23 to form an elongated focus in the substrate 1, wherein the incident energy of the laser beam 27 produces a filament-shaped flaw 32 in the volume of the glass element 200, which filament-shaped flaw extends into the volume to a predetermined depth and, in particular, does not pass through the glass element 200, wherein in order to produce the filament-shaped flaw 32, the ultrashort pulse laser 30 radiates in a pulse or a pulse packet having at least two successive laser pulses, wherein, after at least two adjacent filament-shaped flaws 32 have been introduced, the glass element is exposed to an etching medium 33 which widens the at least two filament-shaped flaws 32, such that a cavity arises, wherein thus overall the structuring method according to the invention is applied to the glass element, and wherein the glass element 200, at at least one of its side surfaces, is connected to at least one further glass part, such that the opening of the cavity 5 is closed by the glass part and a hollow space suitable for guiding liquids is formed, wherein the glass element 200 is connected to the glass part by an applied adhesive, wherein the opening of the cavity 5 in the glass element 200 is omitted when the adhesive is applied. The adhesive may be applied to the side surface of the glass element 200. However, a structured application to the corresponding surfaces of the glass parts is also possible.

A microfluidic cell 12 is thus created which comprises a sheet-like glass element 200 having at least one cavity 5 open on one side, wherein that side surface of the glass element 200 to which the cavity 5 is open is connected to a glass part, such that the cavity 5 is closed by the glass part and forms a hollow space enclosed between the glass element 200 having the cavity 5 and the glass part and suitable for guiding liquids, wherein the glass element 200 having the cavity and the glass part are connected by an adhesive layer, wherein the adhesive layer has an omitted region around the opening of the cavity, such that that part of the wall of the hollow space which is formed by the glass part is omitted from the adhesive layer and may be formed by the material of the glass part closing the cavity.

In accordance some embodiments, a microfluidic cell 12 is produced by connecting at least three glass parts. Hollow structures suitable for guiding liquids can then also be produced by a procedure in which the central glass element 3 has one or more through-openings, which are then closed in the course of connection to the other two glass parts. Accordingly, provision is made for structuring a sheet-like glass element having a thickness of at most 700 micrometers, such as at most 500 micrometers, such that said glass element has at least one opening which connects the two opposite parallel side surfaces of the glass element, and each of the side surfaces of the glass element is connected to a glass part, such that the opening is closed by the two glass parts and a microfluidic cell having a hollow space enclosed between the further glass parts and further for guiding liquids is formed, wherein the glass element is connected to at least one of the two glass parts by an applied adhesive, wherein the at least one opening in the glass element is omitted when the adhesive is applied. The adhesive may once again be applied to the side surfaces of the glass element. However, a structured application to the corresponding surfaces of the glass parts is also possible. In this case, at least one of the glass elements, that is to say the central glass element or the outer glass parts, also has a cavity according to the invention, the opening of which is closed during connection. The cavity can form a separate hollow space or be a part of the hollow space created through the opening in the central glass element.

In some embodiments, even thinner glasses are also used for the central glass element, namely having a thickness of at most 300 micrometers, for example of 210 micrometers or less. Even glasses having a thickness of 100 micrometers or thinner, for instance at most 70 am, can be structured and used as a glass element for the microfluidic cell. For particularly small structures, it is also possible to structure extremely thin glasses having a thickness of at most 70 μm, such as at most 50 μm, or even only at most 30 μm, with openings. Generally, the same method is suitable for the production of openings as for the production of a cavity open on only side, as has already been explained above in relation to FIG. 10. Accordingly, in some embodiments, it is very generally provided that, in addition to the cavity 5 open on one side, a through-opening is created in the substrate 1 by introducing filament-shaped flaws 32 extending through the substrate 1 and by expanding the filament-shaped flaws 32 by the etching medium. The wall of such a through-opening then typically has hemispherical depressions just like the cavity 5 open on one side. As in the example from FIG. 10B, the through-opening can extend to the opposite side surface of the substrate proceeding from the cavity. However, it is likewise also possible to produce a through-opening alongside a cavity 5.

Figure 14:
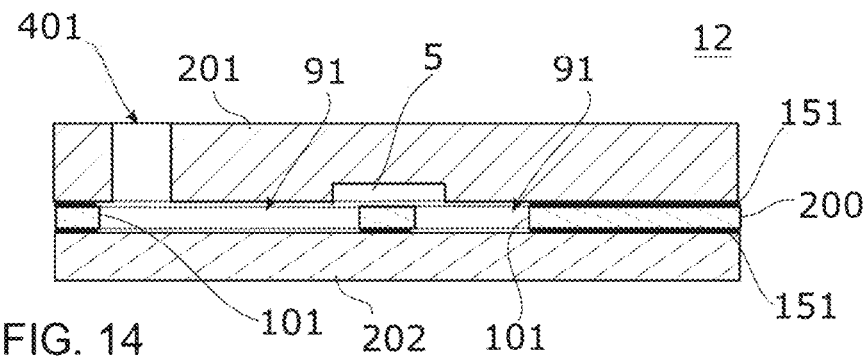
FIG. 14 illustrates an exemplary embodiment of a microfluidic cell.
Figure 15:
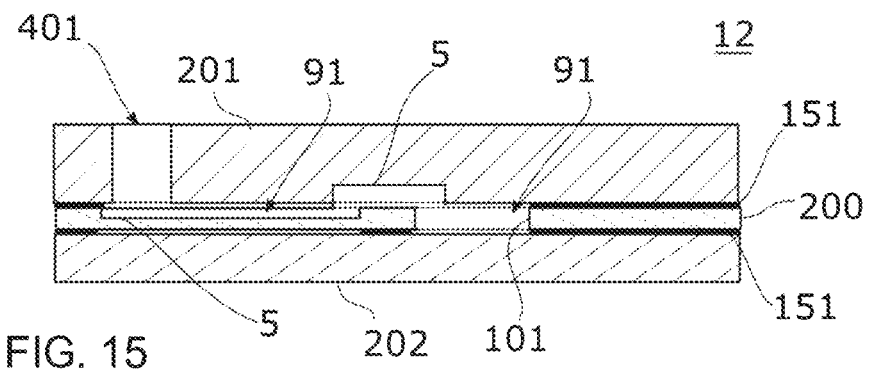
FIG. 15 illustrates an exemplary embodiment of a microfluidic cell.

FIGS. 14 and 15 show in this regard, in cross-section, examples of a microfluidic cell 12 comprising three glass parts, namely a glass element 200 and glass parts 201, 202. The glass element 200 comprises one or more through-openings 101, which are closed by the connection to the glass parts 201, 202 and in this way form one or more hollow spaces 91 of the microfluidic cell 12 for receiving and/or guiding liquids. The glass part 201 has a through-opening 401, which is connected to a hollow space 91 and in this way serves as a filling opening.

The glass part 201 in the example shown in FIG. 14 has a cavity 5 produced according to the invention, which cavity is arranged such that it connects the two hollow spaces 91, such that the two hollow spaces 91 communicate via the cavity 5.

FIG. 15 is a variant in which a cavity is introduced in the glass element 200 arranged between the glass parts 201, 202. The cavity 5 forms for example a channel for connecting a hollow space 91 to the filling opening 401. Both exemplary embodiments are based on an embodiment of the method in which an opening 401 is present in or is introduced into at least one of the glass parts 201, 202, wherein the glass part 201, 202 is combined with the glass element 200 such that the opening 401 produces a fluid-guiding connection into the hollow space 91 produced during connection.

The glass parts of the microfluidic cell 12 are connected to one another as illustrated by adhesive layers 151. In this case, the openings 101 and the cavities 5 are omitted from the adhesive layer 151. The adhesive is generally thus applied such that the edges of the through-openings and cavities are adhesive-free.

Figure 16:
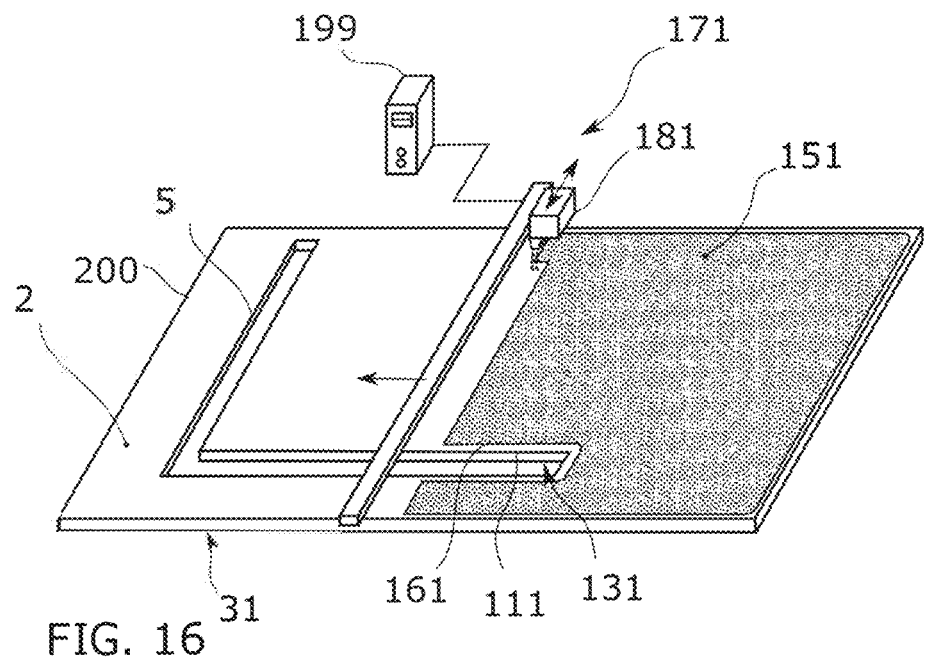
FIG. 16 illustrates an arrangement for applying an adhesive layer.

FIG. 16 shows an arrangement for coating a side surface 2 of a glass part 201, 202 or glass element 200 with an adhesive layer 151. The adhesive is applied here by a structured printing method, in which the adhesive is applied to the respective side surface 2 of the glass element 200 selectively whilst omitting a region 131 extending over the opening of the cavity 5 in the glass element 200. In accordance with some embodiments of the invention, a printing apparatus 171 having a print head 181 driven by a computer 199 is used for this purpose. The print head can be an inkjet print head, for example, which is moved over the glass element 200 while it dispenses the adhesive droplet by droplet. The computer 199 drives the print head such that the region 131 in which the elongated cavity 5 lies is omitted. By way of example, the print head can be moved over the glass element 200 in a meandering manner, wherein the print head 181 is moved back and forth on a cross-member and the cross-member or alternately the glass element 200 is displaced line by line. Generally, without restriction to a specific printing or applying method, one development of the invention provides for the adhesive layer 151 to be applied such that the region 131 omitted from the adhesive layer 151 is larger than the through-opening or cavity to be omitted, such that the edge 161 of the applied adhesive layer 151 is spaced apart, in particular set back, from the edge 111 of the opening 101 or the cavity 5.

The printing method as illustrated in FIG. 16 is purely illustrative. Further printing methods are pad printing, screen printing, stencil printing, roll coating, or roll-to-roll coating, dispensing, stamp transfer. Printing methods such as pad printing and screen printing are suitable particularly for relatively large numbers. In one exemplary embodiment, for the production of a microfluidic cell 12 by screen printing, an acrylate adhesive having a viscosity of 9600 mPa·s was applied to the glass element 200 on both sides. By positioning markers, it is possible to align not only the glass element 200 with the glass parts 201, 202, but also the screen printing mask with the structure of the microfluidic cell.

The viscosity of the adhesive can generally also be adapted to the printing method. In this regard, lower viscosities, for example in the region of around 300 mPa·s, may be used for pad printing. Even lower viscosities, such as of less than 50 mPa·s, may be used in the case of the exemplary inkjet method illustrated in FIG. 16.

Some exemplary embodiments of the invention provide for applying a light-curing, such as UV-curing, adhesive 12. The adhesive 12 can then be irradiated with light, such as UV light, through one of the glass parts 5, 7, such that the adhesive cures and adhesively bonds the glass part, or both glass parts 201, 202 in the case of double-sided application, fixedly to the glass element 3. Suitable adhesives, which can also be UV-curing, are silicone-containing adhesives, epoxy resins and acrylates.

While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A substrate composed of hard brittle material, the substrate comprising a cavity on at least one side surface, the cavity including a side wall having formed therein a plurality of rounded, substantially hemispherical depressions adjoining one another, the cavity further including a bottom surface having a structure having a plurality of substantially hemispherical depressions.

2. The substrate of claim 1, wherein the cavity on at least one side surface has a depth of up to 5 mm or extends into the substrate to a depth of at least 50 µm.

3. The substrate of claim 1, wherein a taper angle of a wall of the cavity with respect to an adjoining side surface of the substrate lies in a range of 85° to 95°.

4. The substrate of claim 1, wherein the cavity comprises at least two regions having different depths.

5. The substrate of claim 1, further comprising at least one through-opening having a wall having substantially hemispherical depressions.

6. A microfluidic cell, comprising:
a substrate in the form of a glass element having at least one cavity, the cavity including a side wall having formed therein a plurality of rounded, substantially hemispherical depressions adjoining one another, the cavity further including a bottom surface having a structure having a plurality of substantially hemispherical depressions.

7. The microfluidic cell of claim 6, further comprising a glass part connected to a side surface of the glass element to which the cavity is open, such that the cavity is closed by the glass part and forms a hollow space enclosed between the glass element having the cavity and the glass part and suitable for guiding liquids, the glass element having the cavity and the glass part being connected by an adhesive layer, the adhesive layer having an omitted region around an opening of the cavity such that a part of the wall of the hollow space which is formed by the glass part is omitted from the adhesive layer.

\* \* \* \* \*